United States Patent
Koike

(10) Patent No.: US 7,817,486 B2
(45) Date of Patent: Oct. 19, 2010

(54) SEMICONDUCTOR STORAGE DEVICE

(75) Inventor: Tsuyoshi Koike, Kyoto (JP)

(73) Assignee: Panasonic Corporation, Osaka (JP)

( * ) Notice: Subject to any disclaimer, the term of this patent is extended or adjusted under 35 U.S.C. 154(b) by 180 days.

(21) Appl. No.: 12/267,275

(22) Filed: Nov. 7, 2008

(65) Prior Publication Data

US 2009/0141565 A1    Jun. 4, 2009

(30) Foreign Application Priority Data

Nov. 7, 2007    (JP) ............... 2007-289330

(51) Int. Cl.
*G11C 11/416* (2006.01)
(52) U.S. Cl. .................. 365/203; 365/189.011
(58) Field of Classification Search ........... None
See application file for complete search history.

(56) References Cited

U.S. PATENT DOCUMENTS

| | | | |
|---|---|---|---|
| 5,047,984 A | 9/1991 | Monden | |
| 5,677,889 A | 10/1997 | Haraguchi et al. | |
| 5,754,487 A * | 5/1998 | Kim et al. | 365/203 |
| 2002/0159309 A1* | 10/2002 | Yamanaka | 365/200 |
| 2006/0158943 A1* | 7/2006 | Park et al. | 365/203 |

FOREIGN PATENT DOCUMENTS

| | | |
|---|---|---|
| JP | 61-165885 | 7/1986 |
| JP | 64-054756 | 3/1989 |
| JP | 04-184787 | 7/1992 |
| JP | 05-166383 | 7/1993 |
| JP | 05-290592 | 11/1993 |
| JP | 07-254281 | 10/1995 |
| JP | 08-031192 | 2/1996 |
| JP | 2003-288788 | 10/2003 |

OTHER PUBLICATIONS

Khellah, Muhammad et al., "Wordline & Bitline Pulsing Schemes for Improving SRAM Cell Stability in Low-Vcc 65nm CMOS Designs," 2006 Symposium on VLSI Circuits Digest of Technical Papers.

* cited by examiner

*Primary Examiner*—Hoai V Ho
*Assistant Examiner*—James G Norman
(74) *Attorney, Agent, or Firm*—McDermott Will & Emery LLP

(57) ABSTRACT

A bit line potential monitor circuit is provided in a bit line, and a step-down circuit of the bit line is controlled base on information from the monitor circuit. As a result, the bit line is easily stepped down to an optimal potential level in accordance with a potential and a load capacity thereof without being affected by variability in devices or operation conditions.

8 Claims, 24 Drawing Sheets

SEMICONDUCTOR STORAGE DEVICE

BACKGROUND OF THE INVENTION

1. Field of the Invention

The present invention relates to a semiconductor storage device comprising a memory cell, a bit line connected to the memory cell, and a step-down circuit which steps down a potential of the bit line up to a predetermined voltage level lower than a power supply voltage before data is read from the memory cell.

2. Description of the Related Art

In the field of a semiconductor storage device, there is a conventional technology in which, for the purpose of improving a data reading speed, a bit line precharged with a power supply voltage is stepped down up to a predetermined voltage level lower than the power supply voltage before data is read, so that a period of time required for a voltage level in the bit line to change from the power supply voltage level to the ground level is shortened. The change from the power supply voltage level to the ground level in the bit line is detected by a PMO transistor provided at a subsequent gate. However, when a step-down level in the bit line is below the operation region of a transistor for detection, through current and a data-read error may occur. A data-read error also occurs in the case where a sense amplifier or a PMOS cross driver is connected to the bit line. Therefore, it is necessary to step-down the voltage of the bit line to around a threshold voltage of the PMOS transistor.

In a DRAM circuit where the bit line is precharged at the power supply voltage level, charges at the power supply voltage level of the bit line flow into a node of the SRAM at which "L" data is retained upon the activation of a word line, in a non-selected column operated when data is being read or written. The inflow of too many charges results in the occurrence of a data-write error. There is an indicator called a static noise margin as an indicator which shows a level of resistance against the data-write error.

In recent years, a static noise margin has been decreasing as the miniaturization of a semiconductor structure is advanced, and there is an increasing demand for the assurance of a certain static margin. As a response to the recent demand, there is a conventional technology wherein a potential of the bit line at the power supply voltage level is stepped down so as to reduce the flow of current from the bit line into the node of the memory cell at which "L" data is stored when the word line is activated. In the case where a step-down of the bit line is not enough, a data-write error occurs due to the reason described above. On the other hand, in the case where the step-down is excessive, a data-write error is caused by charges of "L" level of the bit line which flow into the node of the SRAM at which "H" data is retained. Therefore, it is necessary for a step-down level in the bit line to be at most such a voltage level that can assure the static noise margin and at least such a voltage level that does not result in the destruction of data.

Below is described a technology for the step-down operation in the bit line in a semiconductor storage device relating to the present invention referring to FIG. 24. FIG. 24A is a circuit diagram illustrating a constitution of a semiconductor storage device relating to the present invention, and FIG. 24B is a timing chart illustrating an operation of the semiconductor storage device.

In FIG. 24A, 11 denotes a SRAM memory cell, 12 denotes a precharge circuit, 13 denotes a reading circuit, 14 denotes a step-down circuit, BL and BL⁻ denote complementary bit lines, WL denotes a word line, PC denotes a precharge control signal, DC denotes a step-down control signal, QP1, QP2 and QP3 denote PMOS transistors constituting the precharge circuit 12, QN11, QP11 and QP12 denote NMOS transistors constituting the step-down circuit 14.

The step-down circuit 14 is provided in order to perform the step-down operation for the bit lines BL and BL⁻ prior to the activation of the word line WL. Sources of the step-down transistors QP11 and QP12 are connected to the ground, drains thereof are driven by the step-down control signal DC.

As illustrated in FIG. 24B, prior to the activation of the word line WL, the precharge control signal PC is negated and turns to "H" level at a timing t51, the precharge transistors QP1 and QP2 and the equalizing transistor QP3 are turned off, which leaves the bit lines BL and BL⁻ in floating state.

At a timing t52, the step-down control signal DC is asserted and turns to "L" level, and the step-down transistors QP11 and QP12 in the step-down circuit 14 are turned on, and the equalizing transistor QN11 is turned on. Then, charges of the bit line BL and BL⁻ are then discharged, and potentials of the bit lines BL and BL⁻ are stepped down to a predetermined voltage level. A possible example of the predetermined voltage level is VDD-Vth. VDD is a power supply voltage used for the precharge, and Vth is a threshold voltage of the MOS transistors.

When the step-down control signal DC is negated and turns to "H" level at a timing t53, the step-down transistors QP11 and QP12 are turned off, and the equalizing transistor QN11 is turned off. As a result, the step-down and equalizing operations for the bit lines BL and BL⁻ are halted.

At a timing t54, the word line WL is asserted, and data is read from the memory cell 11. In the case where "0" is stored in the memory cell 11, current flows from the bit line BL into the memory cell 11, and the potential of the bit line BL is lowered; however, the potential of the complementary bit line BL⁻ is not lowered. The fact that the bit line BL="L" level and the complementary bit line BL⁻="H" level is read out and judged as "0" data by the reading circuit 14. In the case where "1" is stored in the memory cell 11, the current flows from the complementary bit line BL⁻ into the memory cell 11, and the potential of the complementary bit line BL⁻ is lowered; however, the potential of the bit line BL is not lowered. The fact that the bit line BL="H" level and the complementary bit line BL⁻="L" level is read out and judged as "1" data by the reading circuit 14. Broken lines denoting the potentials of the bit lines BL and BL⁻ in FIG. 24B illustrate the potential reduction irrespective of whether it happens to the bit line BL or the complementary bit line BL⁻.

At a timing t55, the word line WL is at "L" level, and the data reading operation is terminated. At a timing t56, the precharge control signal PC is asserted and turns to "L" level, and the precharge transistors QP1 and QP2 and the equalizing transistor QP3 are turned on. Then, the bit lines BL and BL⁻ are precharged with the power supply voltage.

When the semiconductor storage device thus constituted is activated, the step-down levels of the bit lines BL and BL⁻ are adjusted in accordance with a pulse width of the step-down control signal DC. Provided that the step-down level is $\Delta V$, and the pulse width of the step-down control signal DC is Tw, $\Delta V \propto Tw$, which means that the step-down level $\Delta V$ is substantially in proportion with the pulse width Tw of the step-down control signal DC.

Conventionally, the step-down operation for the bit line is performed in an initial stage of an operation cycle prior to the activation of the word line. Because the word line is activated in a short period of time after the start of the cycle, the step-down transistor is controlled based on the step-down control signal having a very small pulse width. In the conventional technology, the step-down level ΔV in the bit line is set based on the pulse width Tw of the step-down control signal DC inputted to the step-down transistors QP11 and QP12. Therefore, when the pulse width Tw of the step-down control signal DC is changed due to operation conditions or variability in devices, a large difference is generated in the step-down level ΔV, which results in malfunctioning.

Along with the miniaturization of a semiconductor memory circuit, the load capacity of a bit line and the pulse width of a step-down control signal exhibit a relatively wider range of variability. As a result, it is increasingly difficult to compensate for the step-down level in the bit line.

Further, a bit line step-down circuit and control circuit which controls the step-down operation occupy a larger area, as a result of which a circuit layout area and a reading speed are unfavorably increased.

SUMMARY OF THE INVENTION

Therefore, a main object of the present invention is to step down a potential of a bit line to an optimal level without being affected by variability in devices or operation conditions.

In order to solve the foregoing problems, a semiconductor storage device according to the present invention comprises:
a memory cell;
bit lines connected to the memory cell, the bit lines transmitting potentials for reading and writing data; and
a bit line potential monitor step-down circuit for monitoring the potentials of the bit lines prior to the writing and reading operations and adjusting a step-down level of the bit lines based on a monitoring result thereby obtained.

The semiconductor storage device may further comprise
a bit line potential monitor circuit for monitoring the potentials of the bit lines prior to the writing and reading operations and generating an intermediate step-down control signal conformable to a monitoring result thereby obtained; and
a step-down circuit for executing a step-down operation for the bit lines based on the intermediate step-down control signal.

According to the constitution provided by the present invention, wherein the step-down level is adjusted in accordance with the potentials (charge amount) of the bit lines, the potential of any bit line can be stepped down to the same level without being affected by variability in pulse widths of the step-down control signal and load capacities of each bit line and the like.

Further, a transistor of an optical dummy pattern in which the monitor circuit is provided in the periphery of the memory cell array is used, which makes it unnecessary to provide the step-down circuit as a peripheral circuit. As a result, the circuit layout area can be reduced.

Further, the activation of the word line is prohibited by the intermediate step-down control signal issued by the bit line potential monitor circuit, which can prevent the occurrence of such an unfavorable event that the word line is activated though the step-down level is not sufficient, and the data of the memory cell is thereby destroyed. Alternatively, the activation of the word line is attenuated when the step-down level is insufficient, which prevents the bit-line current from rapidly flowing into the memory cell. As a result, the destruction of the data in the memory cell can be prevented.

BRIEF DESCRIPTION OF THE DRAWINGS

These and other objects as well as advantages of the invention will become clear by the following description of preferred embodiments of the invention and be specified in the claims attached hereto. A number of benefits not recited in this specification will come to the attention of the skilled in the art upon the implementation of the present invention.

DETAILED DESCRIPTION OF THE INVENTION

Figure 1:
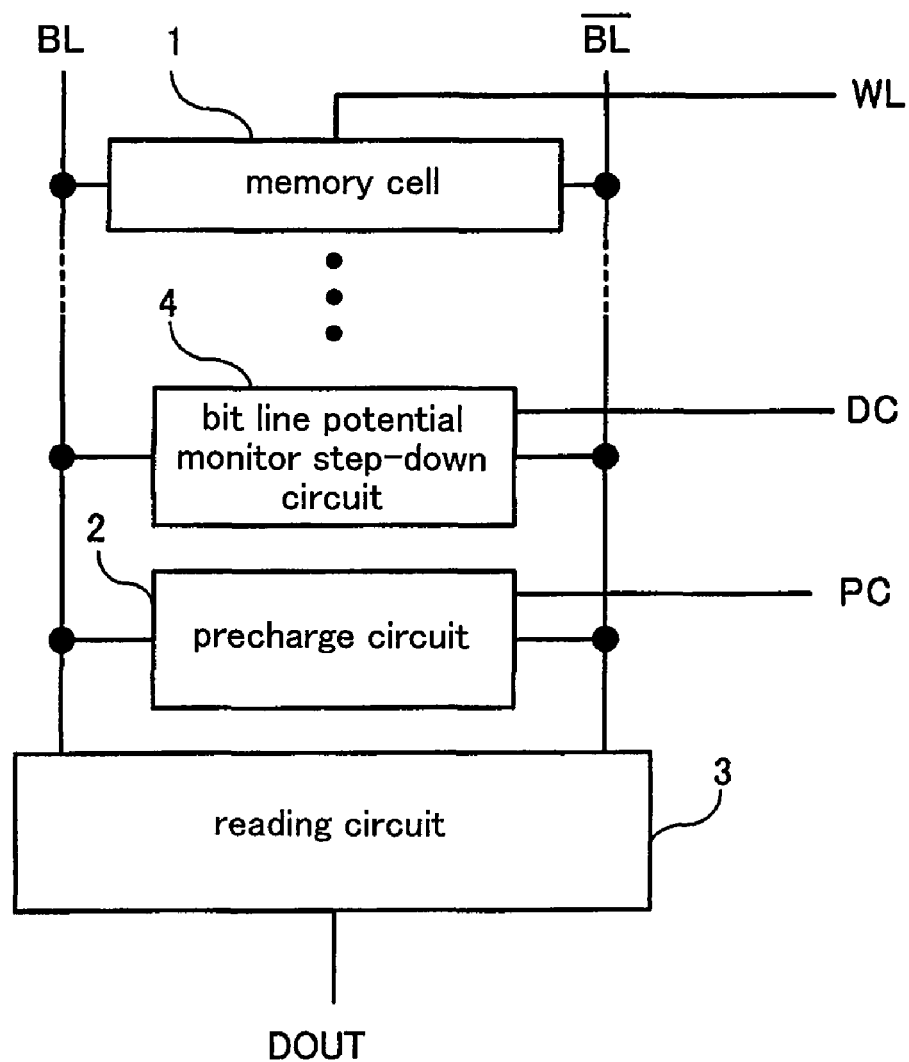
FIG. 1 is a circuit diagram illustrating a constitution of a semiconductor storage device as claimed in claim 1 of the present invention.

Hereinafter, preferred embodiments of a semiconductor storage device according to the present invention are described in detail referring to the drawings.

Preferred Embodiment 1

FIG. 1 is a circuit diagram illustrating a constitution of a semiconductor storage device according to a preferred embodiment 1 of the present invention. The semiconductor storage device according to the present preferred embodiment comprises a memory cell 1, which is SRAM (Static Random Access Memory) activated when accessed via a word line WL, bit lines BL and BL⁻ connected to the memory cell 1 which transmit potentials necessary for writing and reading data, and a bit line potential monitor step-down circuit 4 which monitors the potentials of the bit lines BL and BL⁻ and adjusts step-down levels of the bit lines BL and BL⁻ in accordance with the monitored potentials of the bit lines BL and BL⁻.

Figure 2A:
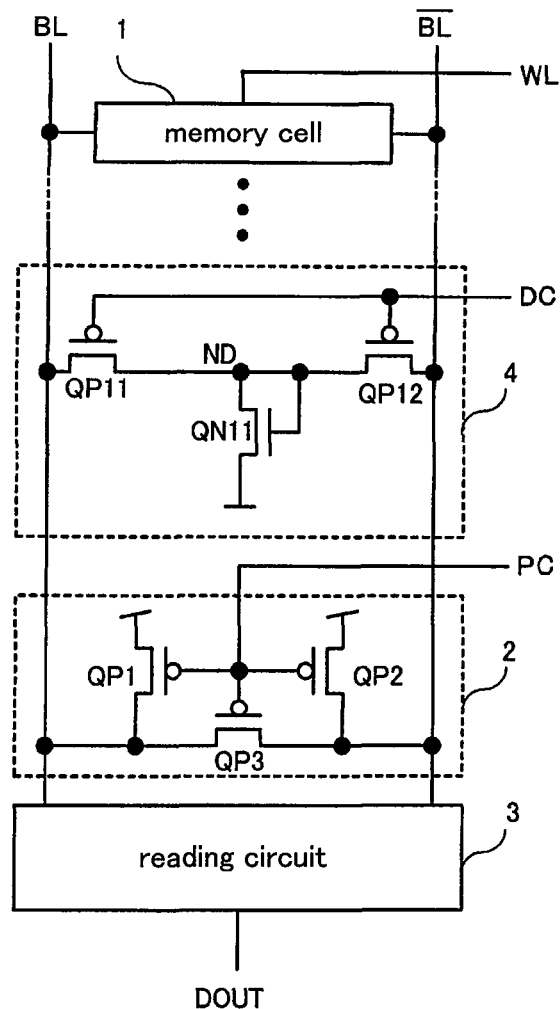
FIG. 2A is an example of a circuit diagram according to a preferred embodiment 1 of the present invention.
Figure 2B:
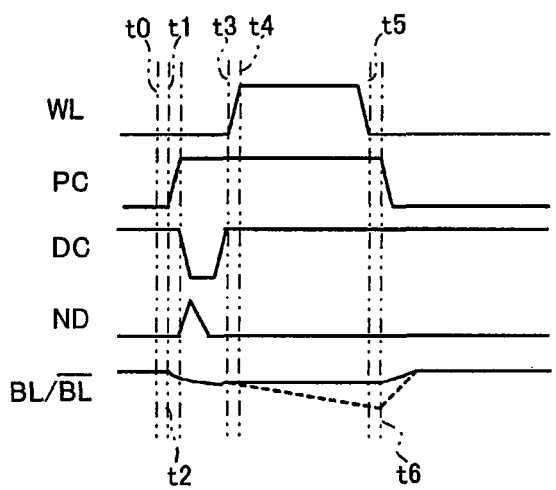
FIG. 2B is a timing chart according to the preferred embodiment 1.

FIGS. 2A and 2B respectively illustrate a specific example of a circuit and a timing chart thereof. As illustrated in FIG. 2A, the precharge circuit 2 comprises switching transistors QP1 and QP2 which are PMOS transistors as switching elements for precharge, and an equalizing transistor QP3. A drain of the precharge transistor QP1 is connected to the bit line BL. A drain of the precharge transistor QP2 is connected to the bit line BL⁻. Gates of the precharge transistor QP1, precharge transistor QP2 and equalizing transistor QP3 are connected to one another, and a supply source (not shown) of the precharge control signal PC is connected to these gates. Sources of the precharge transistor QP1 and the precharge transistor QP2 are connected to a high-potential-side power supply (VDD).

The bit line potential monitor step-down circuit 4 is a circuit controlled by the step-down control signal DC, and comprises bit line potential monitor transistors QP11 and QP12 connected to between the bit lines BL and BL⁻ and a step-down control node ND, and an NMOS step-down transistor QN11. The step-down transistor QN11 is connected to between the step-down control node ND and ground, and a gate signal is inputted thereto from the step-down control node ND.

An operation of the semiconductor storage device according to the present preferred embodiment thus constituted is described below referring to the timing chart illustrated in FIG. 2B. At a timing t0, the low-active precharge control signal PC is in an assert state, while the step-down control signal DC is in a negate state. Because the precharge control signal PC is at "L" level, the precharge transistors QP1 and QP2 and the equalizing transistor QP3 are in the ON state. Accordingly, the power supply voltage VDD is applied to the bit lines BL and BL⁻, and the bit lines BL and BL⁻ are thereby precharged. At the time, the voltage of the step-down control node ND is stably retained at a normal NMOS threshold level.

Prior to the activation of the word line WL (t3), at a timing t1, the precharge control signal PC is negated and thereby turns to "H" level, and the precharge transistors QP1 and QP2 and the equalizing transistor QP3 are thereby turned off, which leaves the bit lines BL and BL⁻ in a floating state.

At a timing t2, the step-down control signal DC is asserted and thereby turns from "H" level to "L" level. Then, the bit line potential monitor transistors QP11 and QP12 in the bit line potential monitor step-down circuit 4 are turned on, and charges stored in the bit lines BL and BL⁻ (power supply voltage level) flow into the step-down control node ND. At the time, the charges flowing into the step-down control node ND are larger as the potentials of the bit lines BL and/BL⁻ are higher and the load capacities of the bit lines BL and /BL⁻ are larger. The inflow of the charges increases the potential of the step-down control node ND, and the step-down transistor QN11 is thereby turned on. When the step-down transistor QN11 is thus turned on, the potential of the step-down control node ND is stepped down, and the potentials of the bit lines BL and /BL⁻ are stepped down via the bit line potential monitor transistors QP11 and QP12. As the potentials of the bit lines BL and /BL⁻ are stepped down and gradually lowered, the charges drawn into the step-down transistor QN11 are reduced.

At a timing t3, the step-down control signal DC turns to "H" level, and the bit line potential monitor transistors QP11 and QP12 are turned off. Then, these bit line potential monitor transistors QP11 and QP12 are disconnected from the ground, and the step-down for the bit lines BL and /BL⁻ stops.

At a timing t4, the word line WL is activated and turns to "H" level, and the data is read from the memory cell 1. The reading operation at the time is similar to that of the conventional technology.

At a timing t5, the word line WL turns to "L" level, and the data reading operation is terminated. At a timing t6, the precharge control signal PC turns to "L" level, and the precharge transistors QP1 and QP2 and the equalizing transistor QP3 are turned on. As a result, the bit lines BL and /BL⁻ are precharged with the power supply voltage.

According to the present preferred embodiment, wherein the bit lines BL and /BL⁻ are stepped down in accordance with the potentials and the load capacities of the bit lines BL and/BL⁻, the step-down can be optimally controlled in the semiconductor storage device without being affected by the variability of the load capacities of the bit lines BL and /BL⁻ and the change of the operation voltages. Further, the constitution according to the present preferred embodiment facilitates adjustments which are necessary for the designing of semiconductor storage devices having the same circuits but different capacitances, which reduces the number of designing steps.

Further, the step-down performance changes (reduces) in accordance with the potentials of the bit lines BL and /BL⁻ as the step-down advances. Accordingly, the semiconductor storage device is less affected by the variability of the pulse width of the step-down control signal DC. Further, the PMOS transistors constitute the bit line potential monitor transistors QP11 and QP12. Accordingly, the amount of the charges flowing into the step-down control node ND is more accurately adjusted as the step-down advances in the bit lines BL and /BL⁻. As a result, the step-down control can be sensitively performed.

In the circuit configuration according to the present preferred embodiment, wherein the step-down operation can be halted in a self-regulating manner, a pulse having a minute pulse width is not always necessary. Therefore, the step-down control in the semiconductor storage device can be sensitively performed even though it becomes difficult to generate a minute-width pulse because a transistor having a high threshold value is necessarily used in view of a designing process or a period of time for the step-down control is inevitably short in view of a circuit configuration.

Further, the bit line potential monitor transistors QP11 and QP12 have the same size as that of an access transistor of the memory cell 1, and a driver of the step-down control signal DC has the same size as that of a driver of the word line. Accordingly, a tilt showing the voltage change of the step-down control signal DC and a tilt of the voltage change of the word Line WL can approximate each other. Therefore, the power supply voltage charges which flow into the memory cell 1 when the word line WL is activated can be accurately reproduced. As a result, the bit lines BL and /BL⁻ can be accurately stepped down in accordance with the charges of the bit lines BL and /BL⁻ which flow into the memory cell 1, and the bit lines BL and /BL⁻ of the SRAM can be stepped down to such a level that can assure the static noise margin.

Further, transistors of an optical dummy pattern provided in the periphery of the memory cell array constitute the bit line potential monitor transistors QP11 and QP12 and the step-down transistor QN11. As a result, the step-down function in the semiconductor storage device can be realized without any increase of a circuit layout area. Further, the same devices as the memory cell 1 constitute these transistors QP11, QP12 and QN11. As a result, the step-down control in compliance with the characteristic variability of the transistor of the memory cell 1 can be realized.

Further, the optical dummy transistors are conventionally provided at upper ends and lower ends of the bit lines BL and /BL⁻. Therefore, the respective optical dummy transistors constitute the bit line potential monitor circuits and are used in combination with each other. As a result, the reliability, which is deteriorated by the characteristic variability of the transistor of the memory cell 1, can be improved.

Preferred Embodiment 2

Figure 3:
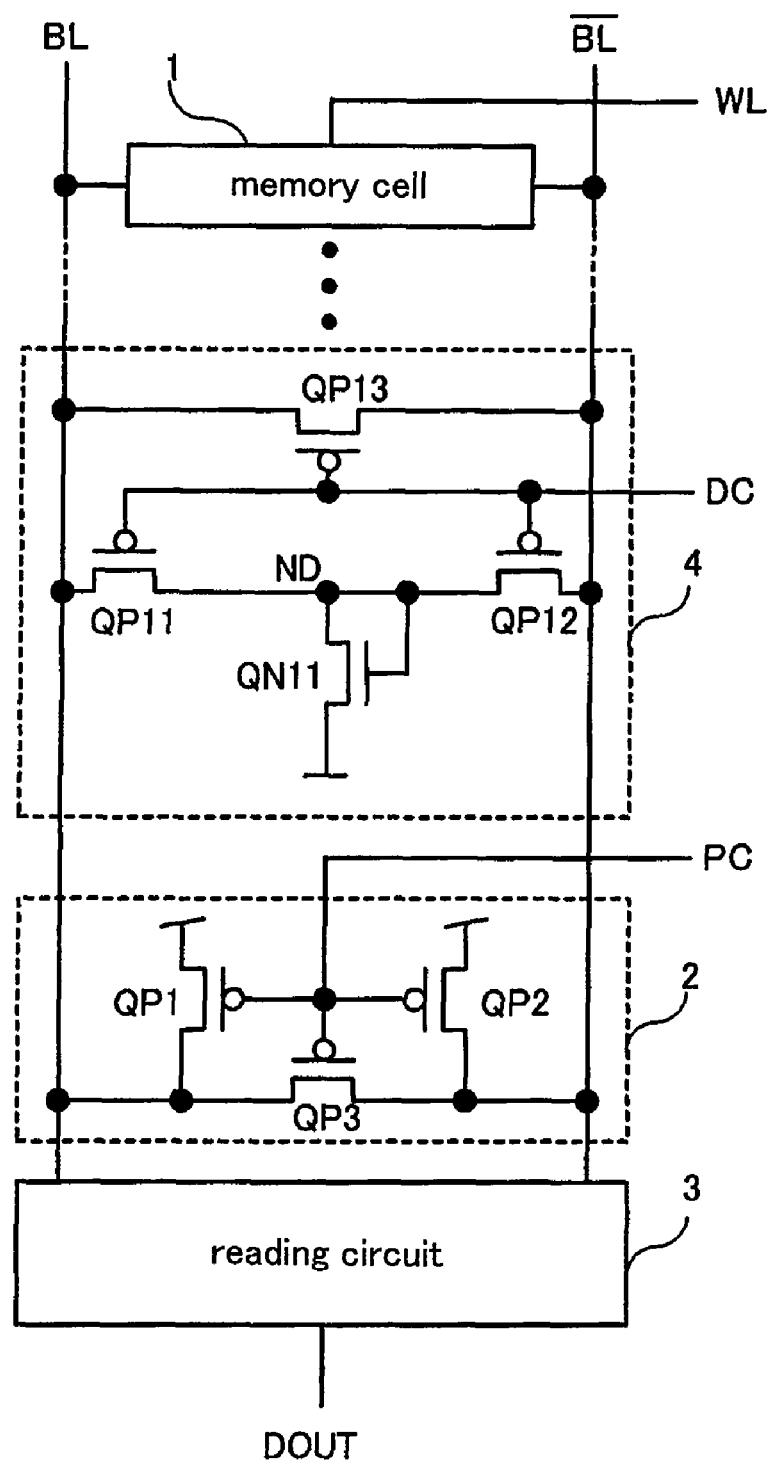
FIG. 3 is an example of a circuit diagram according to a preferred embodiment 2 of the present invention.

FIG. 3 illustrates a circuit configuration of a semiconductor storage device according to a preferred embodiment 2 of the present invention. In FIG. 3, the same reference symbols as those shown in FIG. 2 according to the preferred embodiment 1 denote the same components. The present preferred embodiment is characterized in that an equalizing transistor QP13 is provided. A PMOS transistor constitutes the equalizing transistor QP13. A gate of the equalizing transistor QP13 is connected to the step-down control node ND, and a source and a drain thereof are connected to the bit lines BL and /BL⁻. The equalizing transistor QP13, which is brought into conduction when the step-down control signal DC is at "L" level, can equalize the potentials of the bit lines BL and /BL⁻ during the step-down for the bit lines BL and /BL⁻. The rest of the constitution and the operation, which is similar to that of the preferred embodiment 1, is not described again.

Preferred Embodiment 3

Figure 4A:
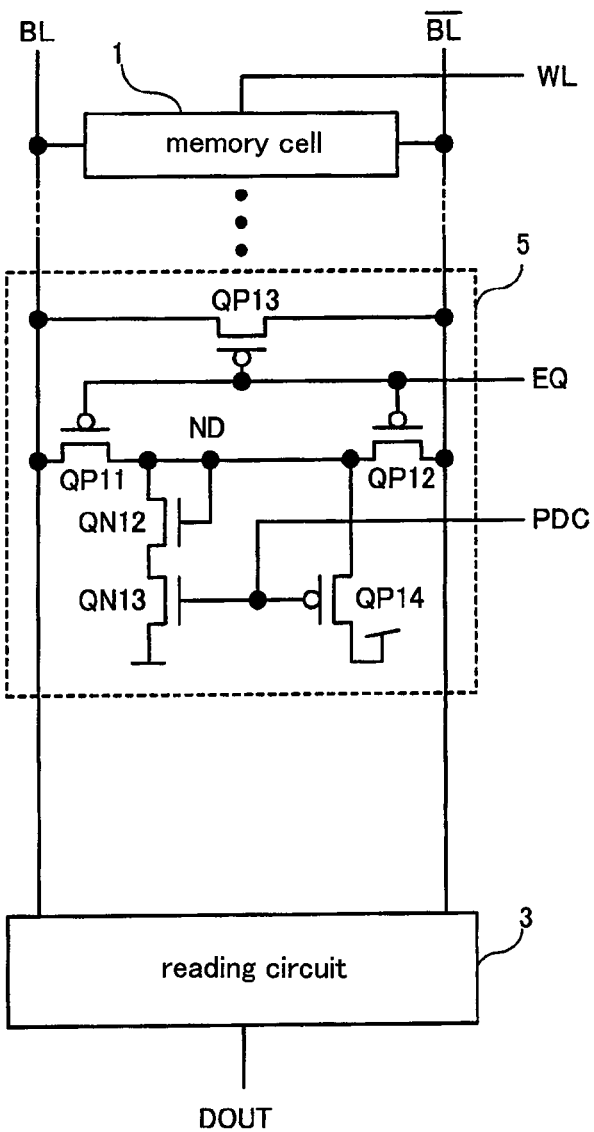
FIG. 4A is an example of a circuit diagram according to a preferred embodiment 3 of the present invention.
Figure 4B:
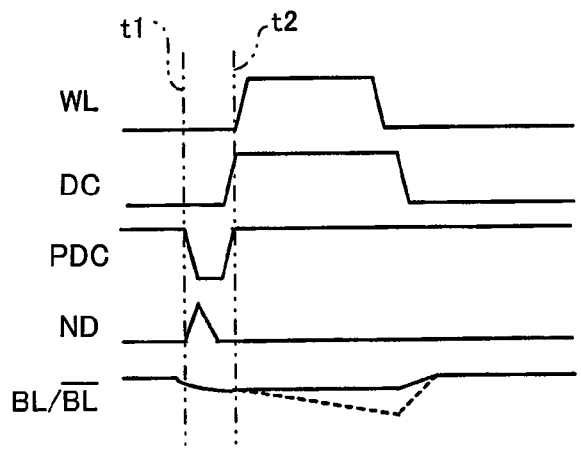
FIG. 4B is a timing chart according to the preferred embodiment 3.

FIG. 4A illustrates a circuit configuration of a semiconductor storage device according to a preferred embodiment 3 of the present invention, and FIG. 4B is a timing chart of an operation thereof. The present preferred embodiment is characterized in that a precharge and bit line potential monitor step-down circuit 5, which is the combination of the bit line potential monitor step-down circuit 4 and the precharge circuit 2 illustrated in FIG. 3, is provided. In this constitution, NMOS step-down transistors QN12 and QN13, which are serially provided in two stages, are connected to between the step-down control node ND and the ground in place of the step-down transistor QN11 illustrated in FIG. 3. Further, a PMOS precharge transistor QP14 is connected to between the step-down control node ND and the power supply voltage. The step-down control node ND is inputted to the step-down transistor QN12, and a precharge/step-down control signal PDC is inputted to the step-down transistor QN13 and the precharge transistor QP14.

An operation of the semiconductor storage device according to the present preferred embodiment thus constituted is described referring to a timing chart illustrated in FIG. 4B. Prior to the activation of the word line WL (timing t2), the precharge/step-down control signal PDC is at "L" level. Accordingly, the precharge transistor QP14 is on, the step-down transistor QN13 is off, and the step-down control node ND is precharged with the power supply voltage. At the time, the equalizing control signal EQ is at "L" level. Therefore, the bit line potential monitor transistors QP11 and QP12 are on, and the bit lines BL and /BL⁻ are precharged with the power supply voltage.

Prior to the activation of the word line WL, the precharge/step-down control signal PDC turns from "L" level to "H" level at a timing t1. Then, the step-down transistors QN12 and QN13 step down the potential of the step-down control node ND to the ground level, and the bit line potential monitor transistors QP11 and QP12 step down the bit lines BL and /BL⁻. When the potentials of the bit lines BL and /BL⁻ are stepped down, the step-down control node ND gradually reaches "L" level, and the current passing through the step-down transistor QN12 is reduced, which slows down the step-down speed. Next, the equalizing control signal EQ turns from "L" level to "H" level, and the step-down of the bit lines BL and /BL⁻ completely stops.

According to the present preferred embodiment, wherein the precharge and bit line potential monitor step-down circuit 5 is configured to include the function of the precharge circuit, the circuit layout area can be reduced. Further, a processing speed can be increased because the load capacities generated in the bit lines BL and /BL⁻ are reduced.

FIG. 4A illustrates the example where the precharge is performed by the precharge and bit line potential monitor step-down circuit 5. However, a precharge circuit may be separately provided so as to assist the precharge in the bit line potential monitor step-down circuit 4.

Preferred Embodiment 4

Figure 5A:
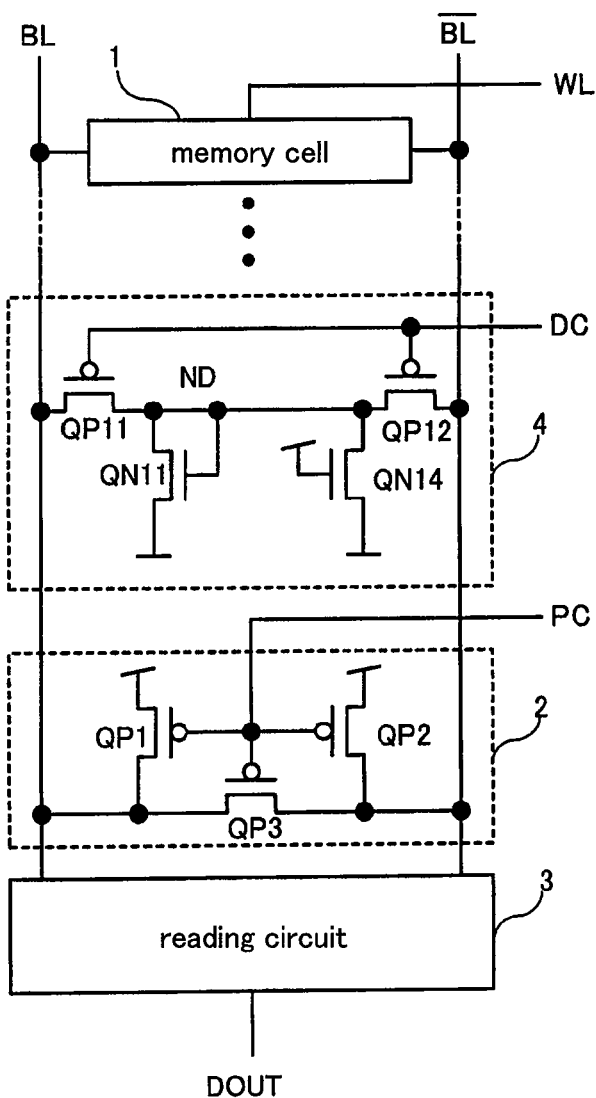
FIG. 5A is an example of a circuit diagram according to a preferred embodiment 4 of the present invention.
Figure 5B:
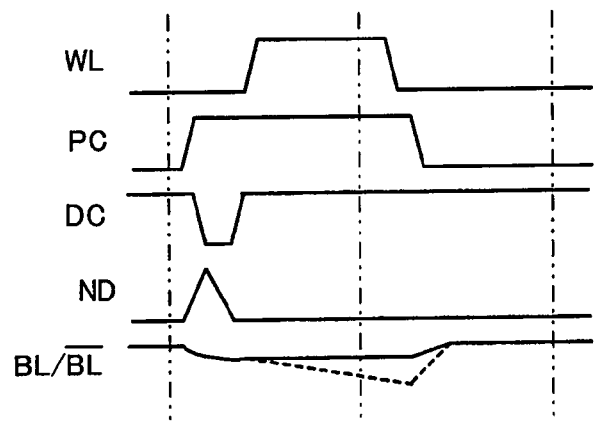
FIG. 5B is a timing chart according to the preferred embodiment 4.

FIG. 5A illustrates a circuit configuration of a semiconductor storage device according to a preferred embodiment 4 of the present invention, and FIG. 5B is a timing chart of an operation thereof. The present preferred embodiment is characterized in that a potential adjusting transistor QN14 is provided. A source of the potential adjusting transistor QN14 is connected to ground VSS, a drain thereof is connected to the step-down control node ND, and a gate thereof is connected to the power supply potential VDD so that the potential adjusting transistor QN14 is constantly in the ON state. When a transistor length and a transistor width of the potential adjusting transistor QN14 thus constituted are adjusted, the potential of the step-down control node ND can be adjusted. Further, the step-down control node ND can be surely set to "L" level upon the completion of the step-down control. Therefore, the step-down control node ND can be easily constantly set to a stationary potential in the case of a high-frequency operation. The operation according to the present preferred embodiment, the timing chart of which is illustrated in FIG. 5B, is basically the same as that of the preferred embodiment 1 illustrated in FIG. 2B. Therefore, the description of the operation is omitted.

Preferred Embodiment 5

Figure 6:
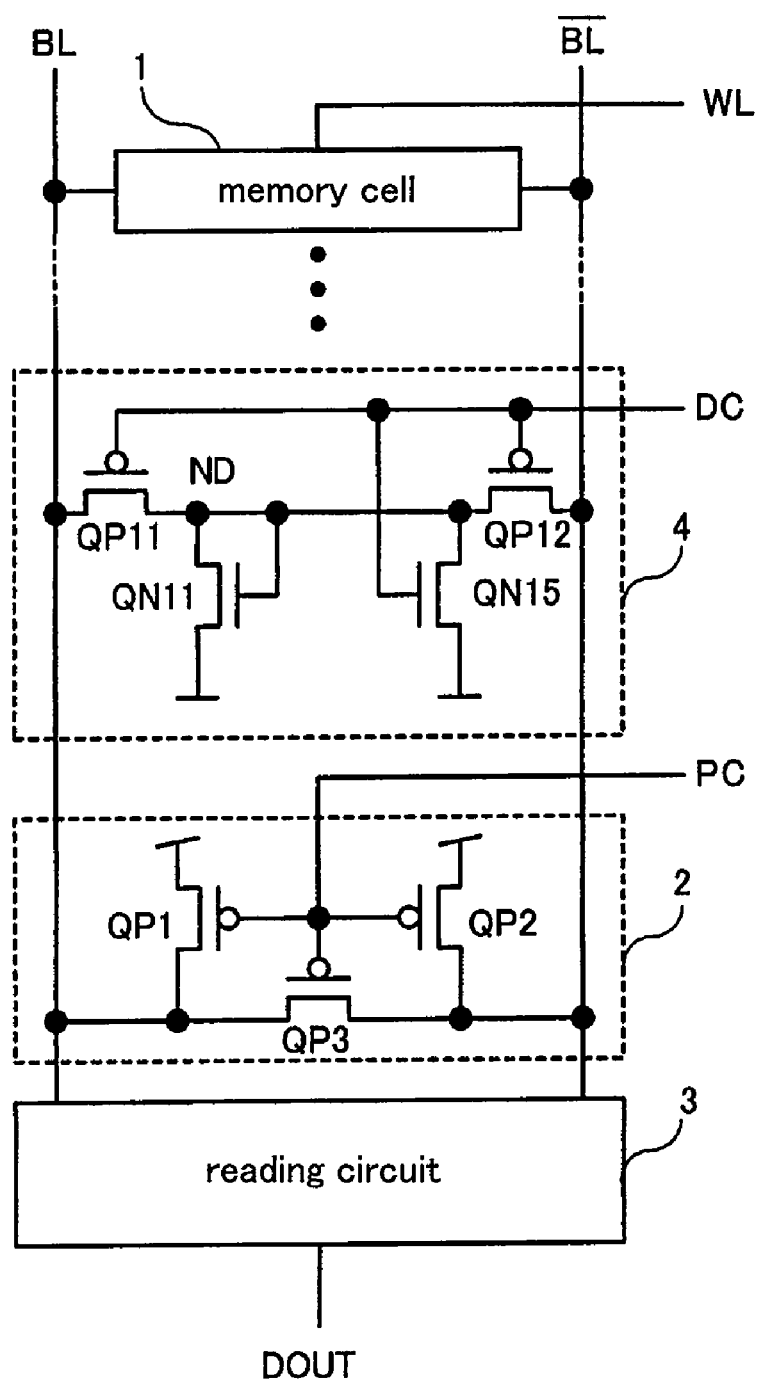
FIG. 6 is an example of a circuit diagram according to a preferred embodiment 5 of the present invention.

FIG. 6 illustrates a circuit configuration of a semiconductor storage device according to a preferred embodiment 5 of the present invention. The present preferred embodiment is characterized in that an initializing transistor QN15 is provided. An NMOS transistor constitutes the initializing transistor QN15. A source of the initializing transistor QN15 is connected to the ground, a drain thereof is connected to the step-down control node ND, and a gate thereof is controlled by the step-down control signal DC. In the constitution according to the present preferred embodiment, the initializing transistor QN15 is turned on only when the step-down control signal DC is at "H" level. Therefore, the constitution is advantageous in that the step-down control node ND is initialized for a period during which the step-down operation is not performed, and the flow of through current is prevented during the step-down operation.

Preferred Embodiment 6

Figure 7:
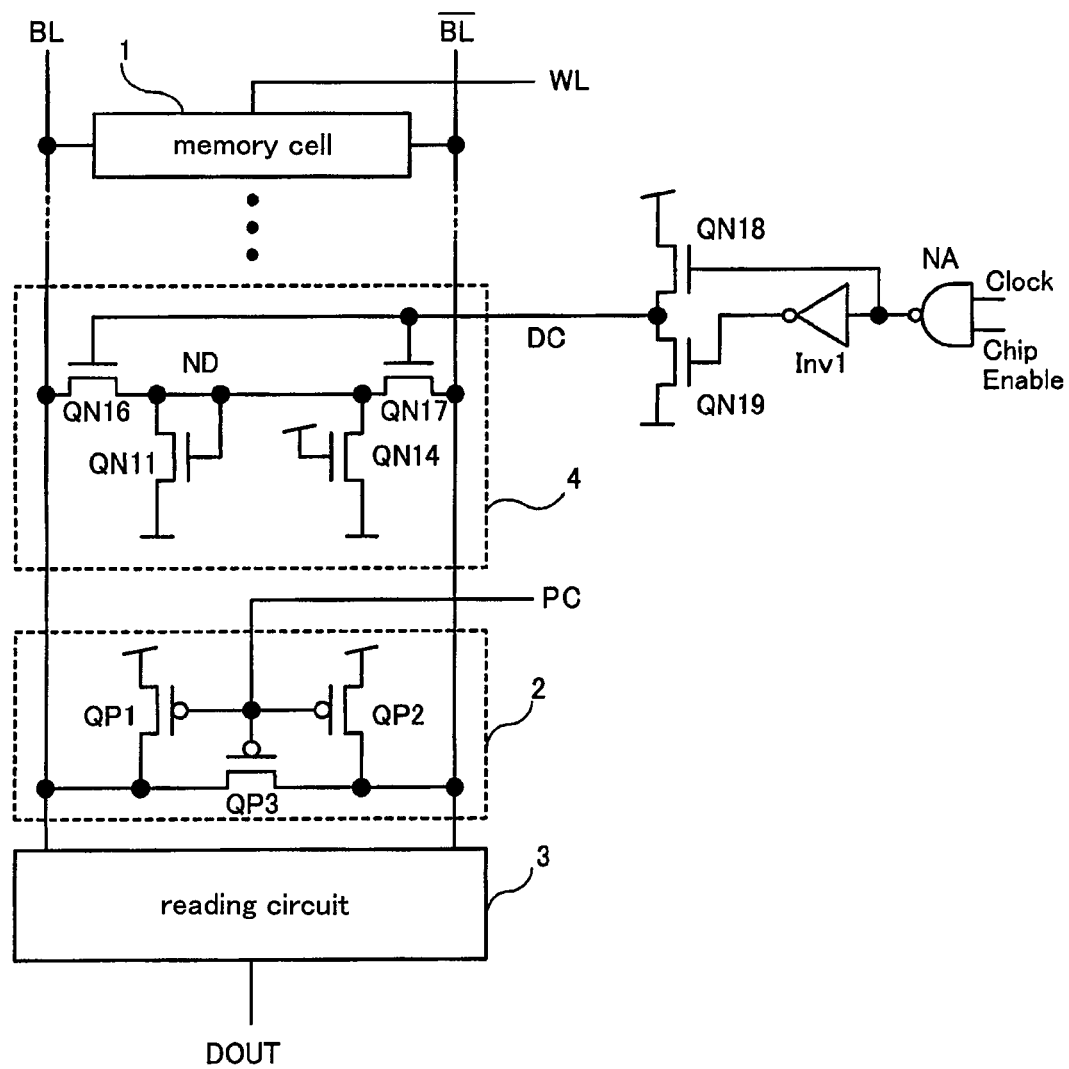
FIG. 7 is an example of a circuit diagram according to a preferred embodiment 6 of the present invention.

FIG. 7 illustrates a circuit configuration of a semiconductor storage device according to a preferred embodiment 6 of the present invention. The present preferred embodiment is characterized in that focus is placed on an output circuit of the step-down control signal DC in the constitution illustrated in FIG. 5 (preferred embodiment 4), and NMOS bit line potential monitor transistors QN16 and QN17 are provided in the bit line potential monitor step-down circuit 4 in place of the PMOS transistors. In FIG. 7, NA denotes a NAND gate, Inv1 denotes an inverter, and QN18 and QN19 denote NMOS switching transistors.

The step-down control signal DC, which is of "H" level drive, is generated in the NMOS switching transistors QN18 and QN19 and is operated with a low amplitude, whereby a current volume of the bit line potential monitor transistors QN16 and QN17 is limited. As a result, it becomes unnecessary to provide the PMOS transistors in the bit line potential monitor step-down circuit 4, which results in the reduction of the circuit layout area.

Referred Embodiment 7

Figure 8:
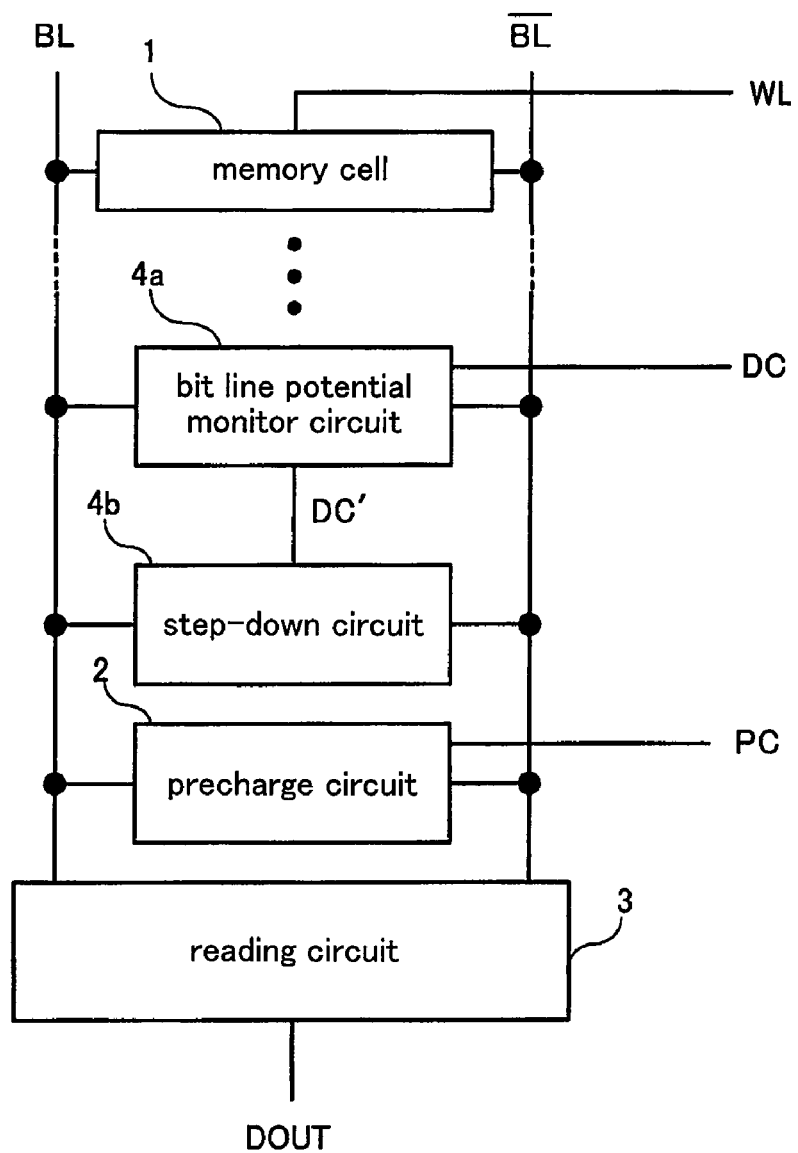
FIG. 8 is an example of a circuit diagram according to a preferred embodiment 7 of the present invention.

FIG. 8 illustrates a circuit configuration of a semiconductor storage device according to a preferred embodiment 7 of the present invention. The present preferred embodiment is characterized in that a bit line potential monitor circuit 4a and a step-down circuit 4b are separately provided. The semiconductor storage device according to the present preferred embodiment comprises a memory cell 1, bit lines BL and BL⁻ connected to the memory cell 1 which transmit potentials necessary for writing and reading data, a bit line potential monitor circuit 4a which monitors the potentials of the bit lines BL and BL⁻ and issues an intermediate step-down control signal DC' when the potentials of the bit lines BL and BL⁻ are lowered to at most a certain potential, and a step-down circuit 4b which steps down the bit lines BL and BL⁻ in accordance with the intermediate step-down control signal DC' from the bit line potential monitor circuit 4a.

In the case where the bit line potential monitor step-down circuit 4 is thus divided into the bit line potential monitor circuit 4a and the step-down circuit 4b, the bit line potential monitor circuit 4a and the step-down circuit 4b can be variously combined as described in the following preferred embodiments.

Preferred Embodiment 8

Figure 9A:
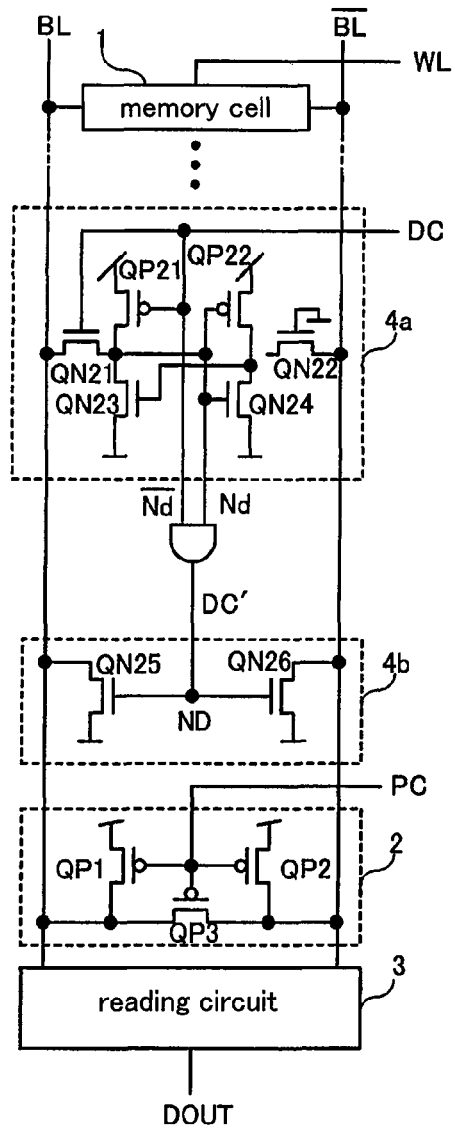
FIG. 9A is an example of a circuit diagram according to a preferred embodiment 8 of the present invention.
Figure 9B:
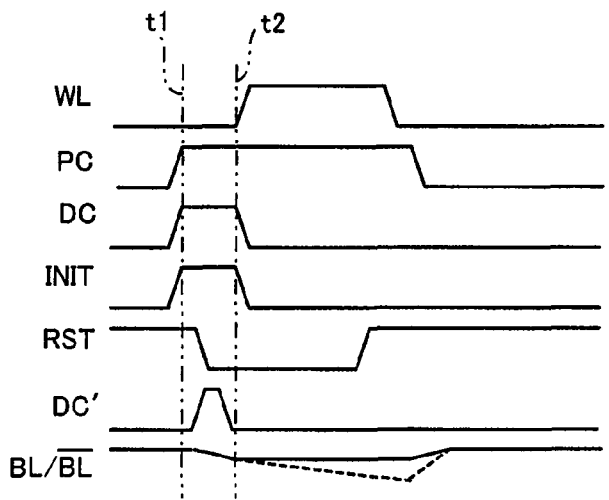
FIG. 9B is a timing chart according to the preferred embodiment 8.

FIGS. 9A and 9B respectively illustrate a circuit configuration according to a preferred embodiment 8 of the present invention wherein a replica memory cell 1' which is not used for data storage constitutes the bit line potential monitor circuit 4a, and a timing chart thereof. When the potentials of the bit lines BL and BL⁻ are overly stepped down, a data retaining property of the memory cell 1 is deteriorated rather than improved. By using the replica memory cell 1' as a memory cell which is easily inverted when the bit lines BL and BL⁻ turn to "L" level, it becomes possible to detect and prevent an excessive step-down. Further, the transistors of the optical dummy pattern provided therein can reduce the circuit layout area.

An operation of the semiconductor storage device according to the present preferred embodiment is described referring to FIG. 9B. During a non-operation period, the step-down control signal DC is at "L" level, a node Nd is initialized to "H" level and a node /Nd is initialized to "L" level by a transistor QP21. Prior to the activation of the word line WL (timing t2), at a timing t1, the step-down control signal DC turns from "L" level to "H" level, the bit line potential monitor circuit 4a (transistor QN21) is turned on, and the step-down control node ND turns from "L" level to "H" level. As a result, the step-down circuit 4b (transistors QN25 and QN26) is turned on, and the step-down starts. When the potentials of the bit lines BL and BL⁻ are stepped down and thereby lowered, a transistor QP22 is turned on, and a transistor QN24 is turned off. Then, a transistor QN23 of the bit line potential monitor circuit 4a is turned on. Accordingly, the node Nd turns to "L" level, the step-down control signal DC' turns to "L" level, and the step-down stops. At that time, by optimally setting the performance of the transistors QP22 and QN24 in the bit line potential monitor circuit 4a, timing by which the transistors QN23 and QN24 are turned on can be adjusted.

Preferred Embodiment 9

Figure 10:
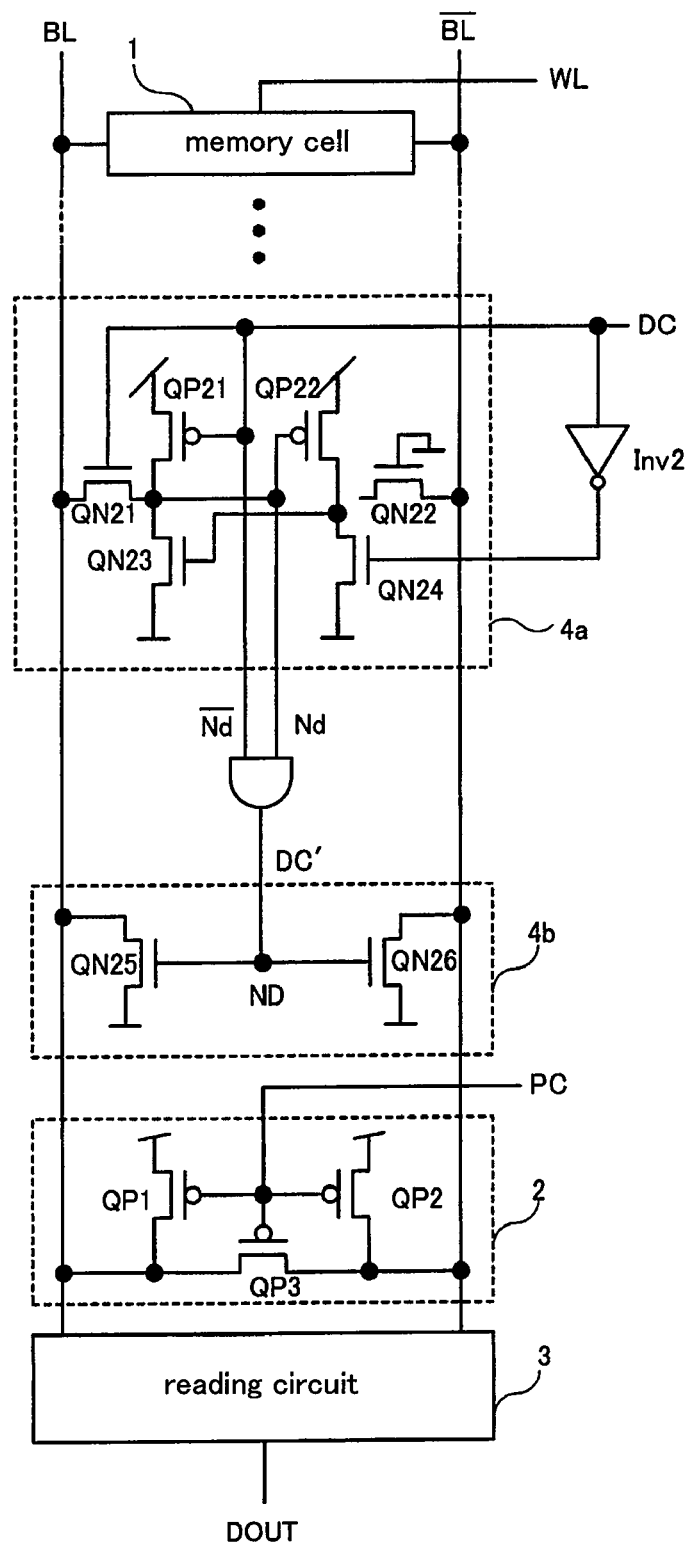
FIG. 10 is an example of a circuit diagram according to a preferred embodiment 9 of the present invention.

FIG. 10 illustrates a circuit configuration according to a preferred embodiment 8 of the present invention wherein the replica memory cell 1' which is not used for the data storage constitutes the bit line potential monitor circuit 4a in a manner similar to FIG. 9. The present preferred embodiment is different to the constitution illustrated in FIG. 7 (preferred embodiment 6) in that an inverter Inv2 which generates a step-down control signal DC⁻ from the step-down control signal DC is provided, and the step-down control signal DC⁻ generated by the inverter Inv2 is inputted to the transistor QN24 (which drives the node /Nd) of the bit line potential monitor circuit 4a. As a result, the initialization can be performed at a higher speed. Further, in the present preferred embodiment, timing by which the transistor QN 24 is turned on in response to the step-down operation for the bit lines BL and BL⁻ can be provided at an earlier time.

Referred Embodiment 10

Figure 11:
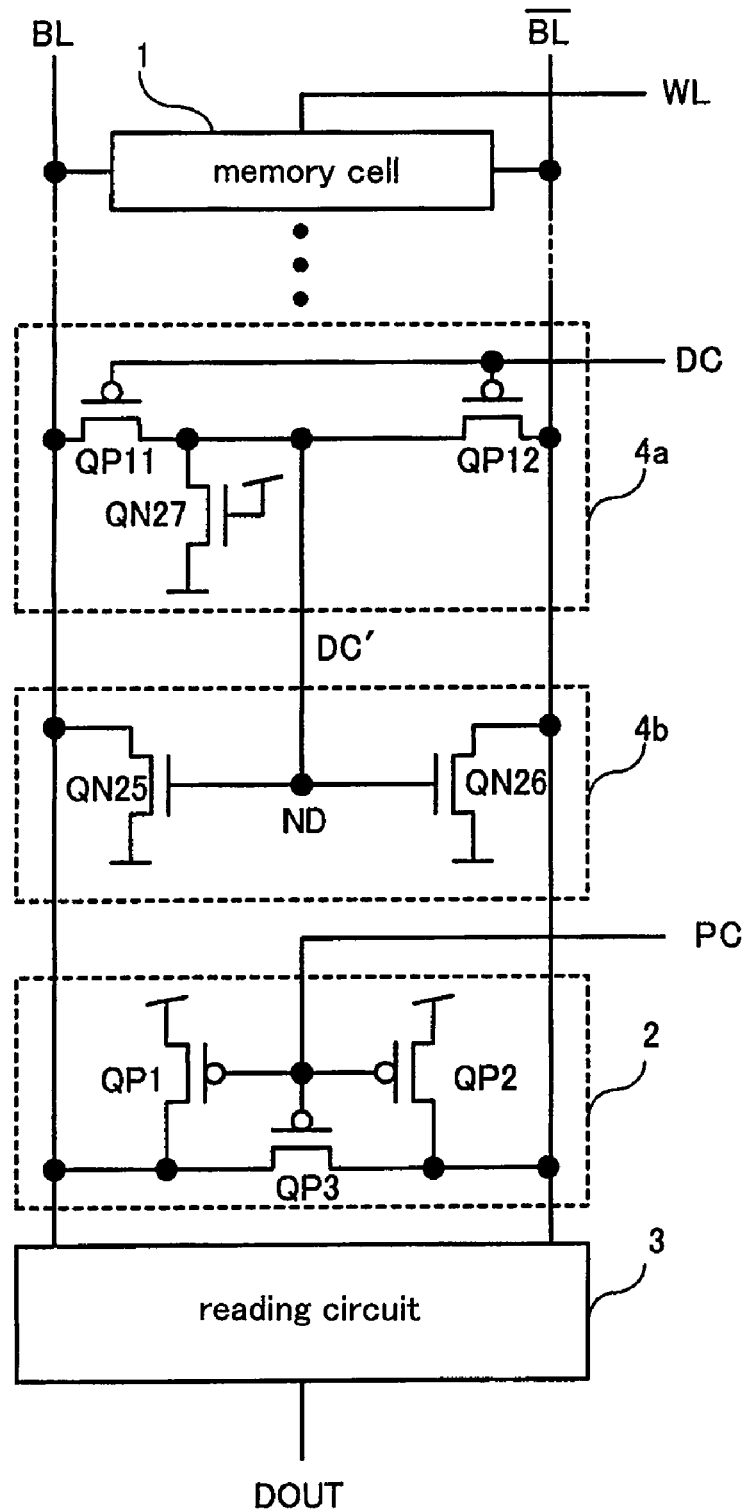
FIG. 11 is an example of a circuit diagram according to a preferred embodiment 10 of the present invention.

FIG. 11 illustrates a circuit configuration of a semiconductor storage device according to a preferred embodiment 10 of the present invention. The present preferred embodiment is characterized in that a bit line potential monitor circuit 4a (transistors QP11 and QP12) to which the step-down control signal DC is inputted is connected to between the bit lines BL and BL⁻ and the step-down control node ND as the bit line potential monitor circuit 4a, and further, a transistor QN27, which is constantly in the ON state, is connected to between the step-down control node ND and the ground.

An operation according to the present preferred embodiment is described. Prior to the activation of the word line WL, the step-down control signal DC turns from "H" level to "L" level. Accordingly, the bit line potential monitor circuit 4a (transistors QP11 and QP12) is turned on, and the charges at the power supply voltage level of the bit lines BL and BL⁻ flow into the step-down control node ND. The potential level of the step-down control node ND is adjusted by these charges and the charges at the ground level supplied to the step-down control node ND via a transistor QN27. The step-down control node ND becomes closer to "H" level due to the inflow charges at the power supply voltage level, and the step-down circuit (transistors QN25 and QN26) is turned on. As a result, the potentials of the bit lines BL and BL⁻ are stepped down. In response to the stepped-down potentials in the bit lines BL and BL⁻, the charges flowing into the step-down control node ND via the bit line potential monitor transistors QP11 and QP12 are lessened, as a result of which the step-down control node ND comes near "L" level. Then, the discharge of the step-down circuit 4b (transistors QN25 and QN26) is attenuated. Then, when the potential has reached a certain level, the transistors QN25 and QN26 are turned off.

It may be necessary to provide a step-down transistor having a large size due to the large loads of the bit lines BL and BL⁻. In such a case, the constitution according to the present preferred embodiment is advantageous in that the size of the step-down transistor can be adjusted in a broad range in comparison to the constitution where the transistor of the optical dummy pattern is used.

Referred Embodiment 11

Figure 12:
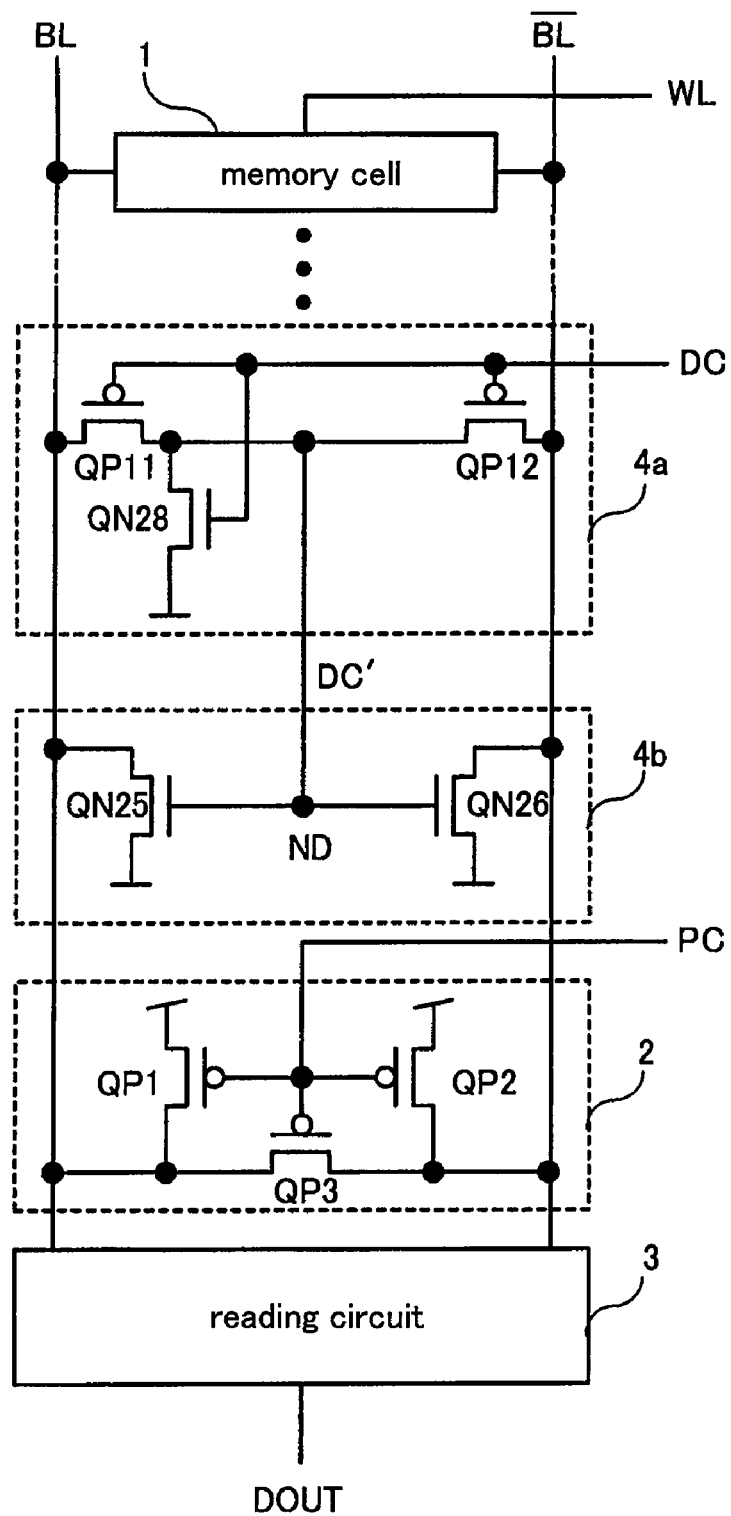
FIG. 12 is an example of a circuit diagram according to a preferred embodiment 11 of the present invention.

FIG. 12 illustrates a circuit configuration of a semiconductor storage device according to a preferred embodiment 11 of the present invention, which is another specific example of the circuit different to the preferred embodiment 10. The present preferred embodiment is different to the constitution illustrated in FIG. 11 (preferred embodiment 10) in that a step-down control node initializing transistor QN28 is connected to between the step-down control node ND and the ground. The step-down control node initializing transistor QN28 is controlled by the step-down control signal DC in place of the transistor QN27 constantly in the ON state connected to the step-down control node ND. The constitution described above can exert an effect similar to that of the preferred embodiment 10.

Referred Embodiment 12

Figure 13:
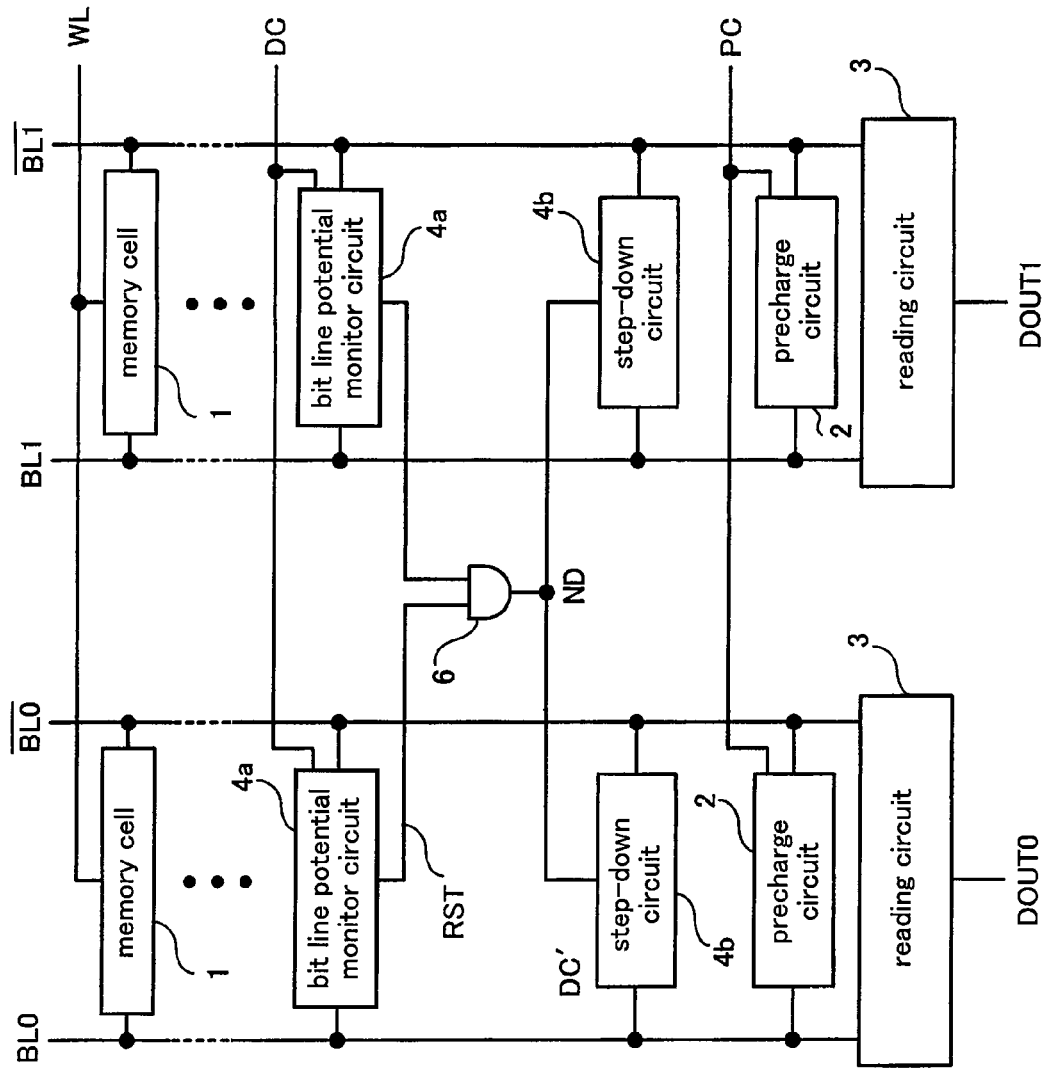
FIG. 13 is an example of a circuit diagram according to a preferred embodiment 12 of the present invention.

FIG. 13 illustrates a circuit configuration of a semiconductor storage device according to a preferred embodiment 12 of the present invention. In the constitution illustrated in FIG. 13 are provided a memory cell 1, bit lines BL and BL⁻ connected to the memory cell 1 which transmit potentials for writing and reading data, a plurality of bit line potential monitor circuits 4a which monitor the potentials of the bit lines BL and BL⁻ and issues an intermediate step-down control signal DC' S1 when the potentials of the bit lines BL and BL⁻ have reached at most a certain potential, a step-down control circuit 6 which obtains AND or OR of the intermediate step-down control signals DC' S1 outputted from the plurality of bit line potential monitor circuits 4a, and a step-down circuit 4b which performs the step-down operation in accordance with the output of the step-down control circuit 6.

The step-down control circuit 6 detects the change from "H" level to "L" level of the intermediate step-down control signal DC' S1 which is the output of anyone of the monitor circuits 4a in the case where the AND of the intermediate step-down control signals DC' S1 is obtained. The step-down circuit 4b halts the step-down operation based on a result of the detection of the step-down control circuit 6. As a result, excessive step-down control which may occur when the characteristics of the monitor circuits 4a vary can be prevented.

Further, the step-down control circuit 6 detects the change from "H" level to "L" level of the intermediate step-down control signals DC' S1 which is the output of all of the monitor circuits 4a in the case where the OR of the intermediate step-down control signals DC' S1 is obtained. The step-down circuit 4b halts the step-down operation based on a result of the detection of the step-down control circuits 6. As a result, deficient step-down control which may occur when the characteristics of the monitor circuits 4a vary can be prevented.

Preferred Embodiment 13

Figure 14:
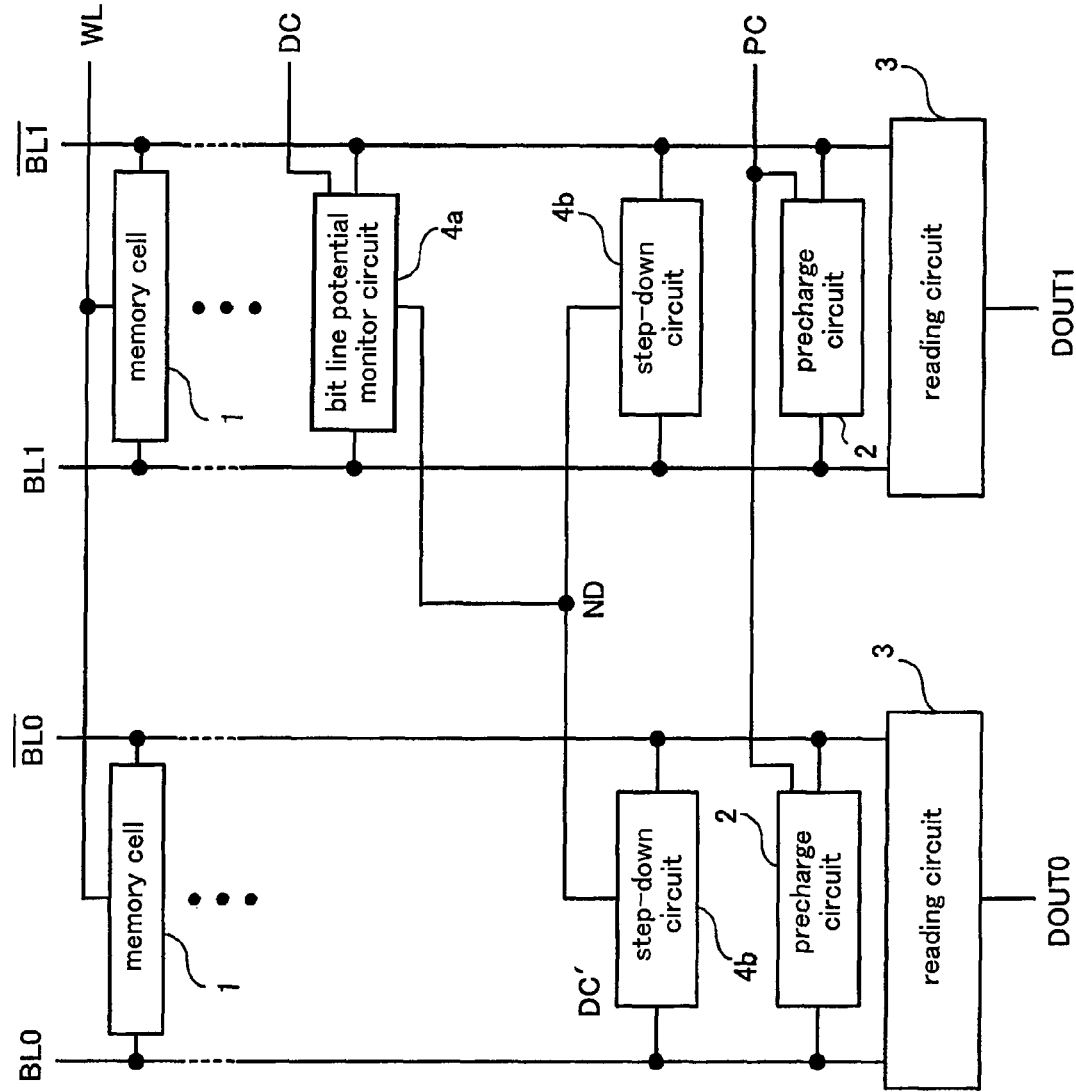
FIG. 14 is an example of a circuit diagram according to a preferred embodiment 13 of the present invention.

FIG. 14 illustrates a circuit configuration of a semiconductor storage device according to a preferred embodiment 13 of the present invention. The present preferred embodiment is characterized in that the bit line potential monitor circuit 4a is shared by a plurality of bit lines BL and BL⁻, and the step-down circuit 4b connected to each bit line is controlled by the intermediate step-down control signal DC' S1 outputted from the shared bit line potential monitor circuit 4a. Accordingly, the number of the bit line potential monitor circuits 4a can be reduced, and the circuit layout area can be thereby curtailed.

Preferred Embodiment 14

Figure 15:
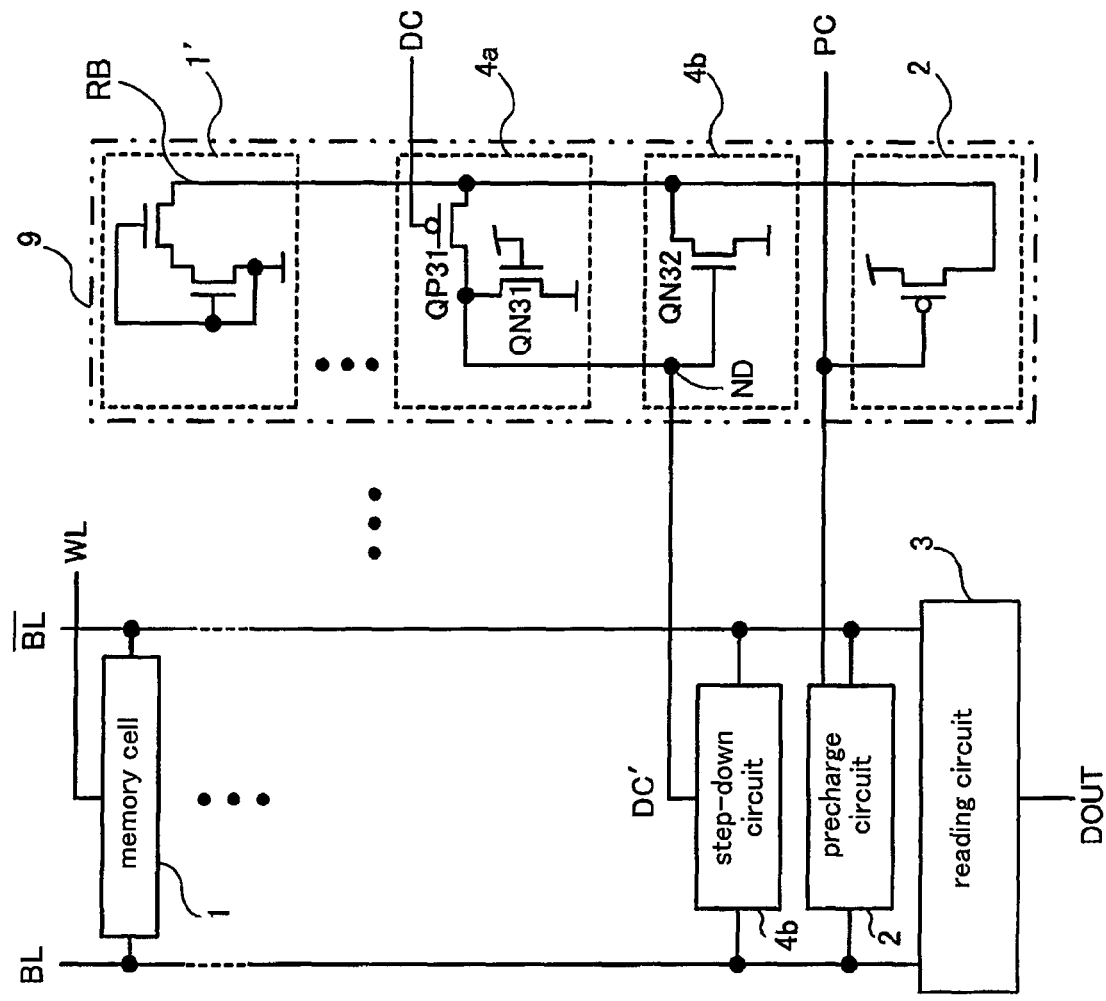
FIG. 15 is an example of a circuit diagram according to a preferred embodiment 14 of the present invention.

FIG. 15 illustrates a circuit configuration of a semiconductor storage device according to a preferred embodiment 14 of the present invention. The present preferred embodiment is characterized in that the bit line potential monitor circuit 4a and the step-down circuit 4b are connected to a replica bit line RB to which the transistors provided as the optical dummy pattern are connected. The step-down circuit 4b which is provided for each bit is controlled by the intermediate step-down control signal DC' S1 outputted from the bit line potential monitor circuit 4a. According to the constitution, it becomes unnecessary to provide the bit line potential monitor circuit 4a for each bit, which results in the reduction of the circuit layout area.

Preferred Embodiment 15

Figure 16:
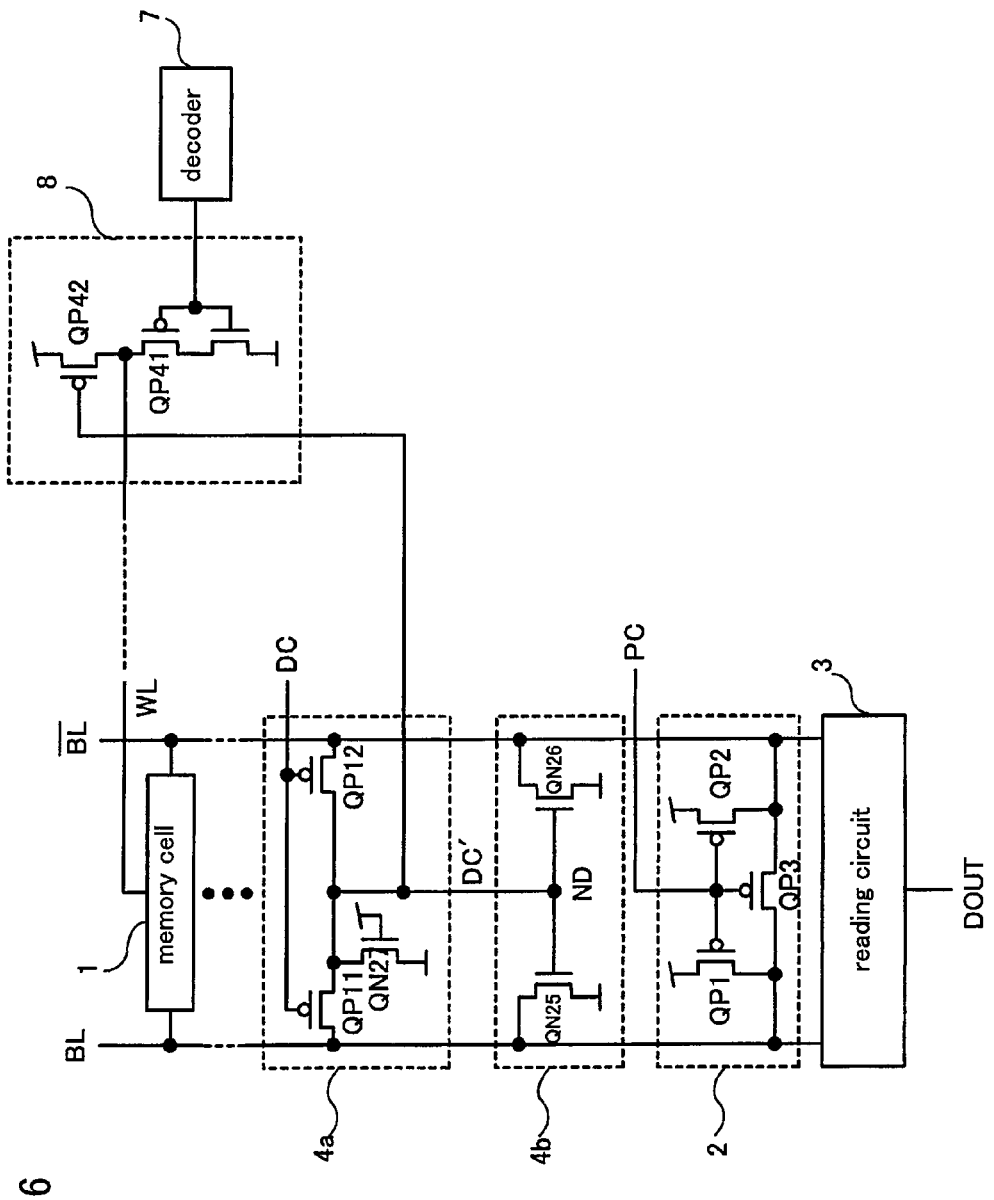
FIG. 16 is an example of a circuit diagram according to a preferred embodiment 15 of the present invention.

FIG. 16 illustrates a circuit configuration of a semiconductor storage device according to a preferred embodiment 15 of the present invention. In FIG. 16, a PMOS transistor QP42, which is a circuit which controls the activation of the word line WL, is connected to between a PMOS transistor QP41 which activates the word line WL and the power supply voltage, and the step-down control node ND for the output signal of the bit line potential monitor circuit 4a is connected to a gate of the PMOS transistor QP42.

An operation according to the present preferred embodiment is described below. When the step-down control signal DC turns from "H" level to "L" level before the word line WL is activated, the bit line potential monitor circuit 4a (transistors QP11 and QP12) is turned on. Then, the charges of the bit lines BL and BL⁻ flow into the step-down control node ND, and the step-down control node ND turns from "L" level to "H" level. Accordingly, the step-down circuit (transistors QN25 and QN26) is turned on, and the bit lines BL and BL⁻ are stepped down. As the potentials of the bit lines BL and BL⁻ are lowered, the step-down control node ND turns from "H" level to "L" level for each step-down. Accordingly, the step-down circuit (transistors QN25 and QN26) is gradually turned off. When the potentials of the bit lines BL and BL⁻ are stepped down up to a threshold level of the PMOS transistor, the word line activation control circuit (PMOS transistor QN42) is turned on. As a result, the word line WL selected based on a decoding result is turned on.

The present preferred embodiment exerts the following effect. In the case where the word line WL is activated during the step-down of the bit lines BL and BL⁻ and the activation is completed even though the step-down level is not sufficient enough, the data in the memory cell 1 is destroyed. In the present preferred embodiment wherein the foregoing operation is executed, such a trouble can be prevented because the activation control circuit (PMOS transistor QP42) is provided. The present preferred embodiment can provide the main constitution by using the output signal of the bit line potential monitor circuit 4a, which makes it unnecessary to provide an additional control circuit. As a result, the increase of the circuit layout area can be minimized.

Preferred Embodiment 16

Figure 17:
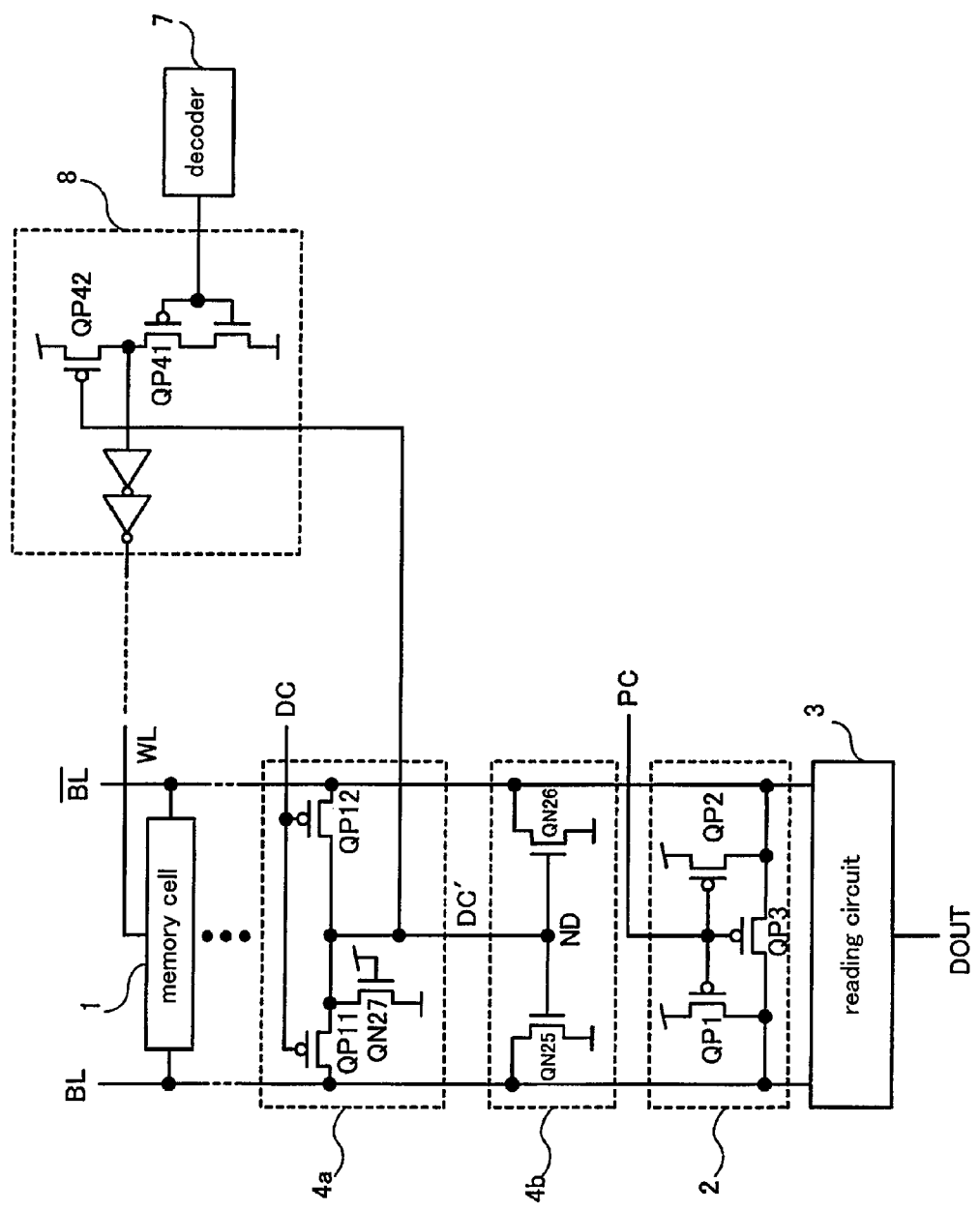
FIG. 17 is an example of a circuit diagram according to a preferred embodiment 16 of the present invention.

In the preferred embodiment 15 (FIG. 16), the word line activation control circuit (transistor QP42) is serially connected to the PMOS of a driver 8 which drives the word line WL. However, the word line activation control circuit (transistor QP42) may be provided in a circuit relating to the logic for changing a word line WL in a previous stage from "L" level to "H" level. The present preferred embodiment describes a specific example of such a constitution. FIG. 17 illustrates a circuit example according to the present preferred embodiment.

Preferred Embodiment 17

Figure 18:
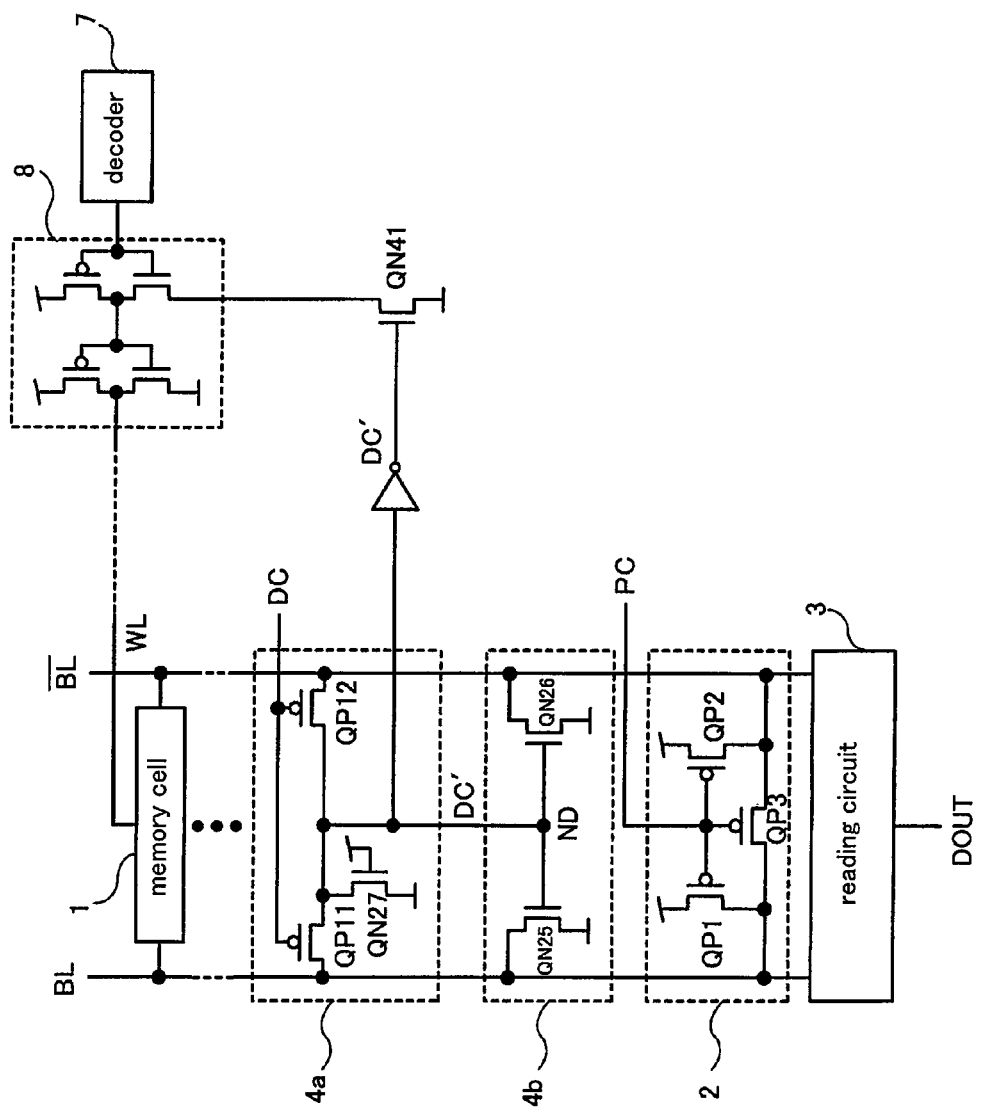
FIG. 18 is an example of a circuit diagram according to a preferred embodiment 17 of the present invention.

A step-down control node ND⁻, which takes the negative logic of the step-down control node ND, can be inputted to the transistor QN41 connected to between a source of an inverter provided in a previous stage of the driver 8 which drives the word line WL and the ground. Accordingly, the transistor QN41 can constitute the word line activation control circuit. The present preferred embodiment describes a specific example of such a constitution. FIG. 18 illustrates a circuit example according to the present preferred embodiment.

Preferred Embodiment 18

Figure 19:
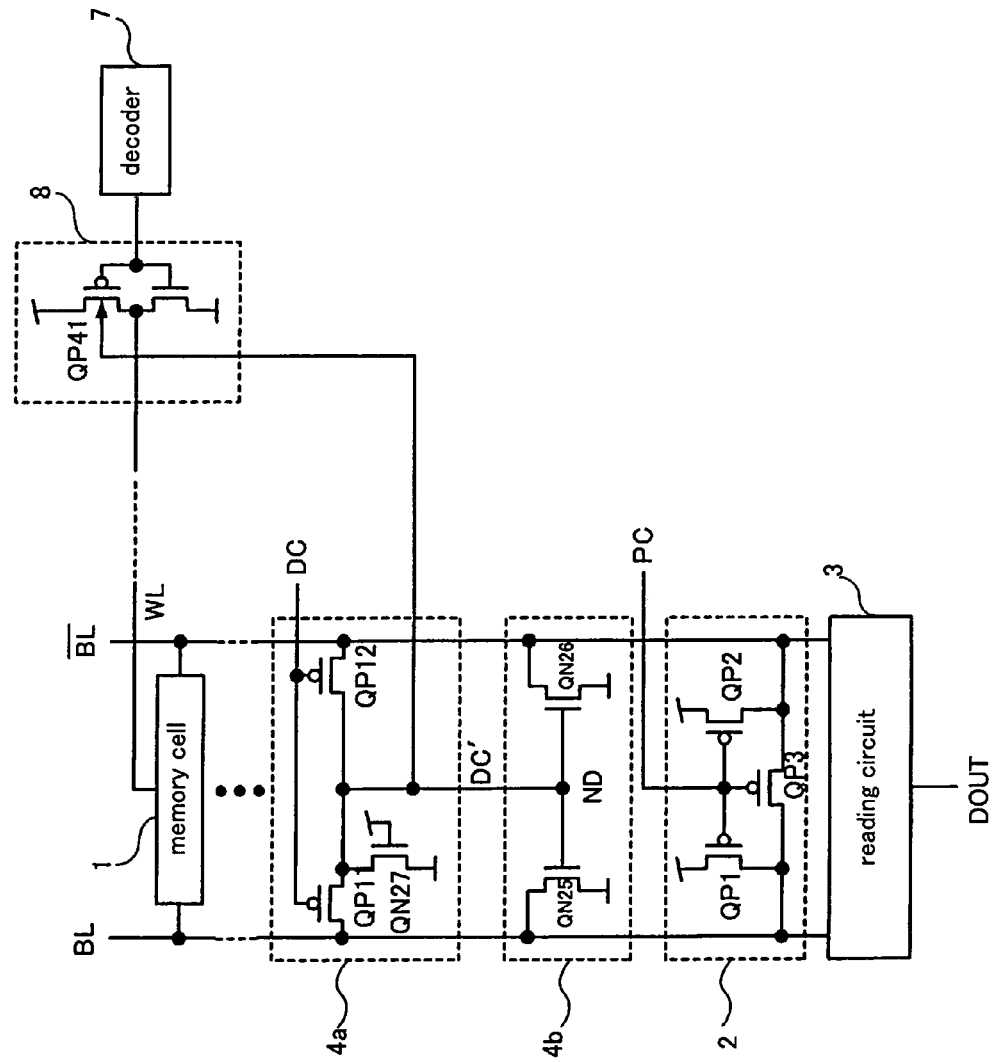
FIG. 19 is an example of a circuit diagram according to a preferred embodiment 18 of the present invention.

FIG. 19 illustrates a circuit configuration of a semiconductor storage device according to a preferred embodiment 18 of the present invention. The present preferred embodiment is characterized in that the step-down control signal DC' is further connected to a substrate of the transistor QP41 which activates the word line WL in the constitution according to the preferred embodiment 16 (FIG. 17). In the present preferred embodiment, the step-down control node ND turns from "H" level to "L" level since the potentials of the bit lines BL and BL⁻ are stepped down during the step-down operation for the bit lines BL and BL⁻; therefore, the transistor QP41 which activates the word line WL is subject to a forward bias. Therefore, the word line WL can be more efficiently activated as the potentials of the bit lines BL and BL⁻ are more stepped down. Thus constituted, the word line WL is not rapidly activated in the case where the potentials of the bit lines BL and BL⁻ are not sufficiently stepped down yet. As a result, the charges which flow into the memory cell 1 are controlled, and the destruction of the data in the memory cell can be prevented.

Preferred Embodiment 19

Figure 20:
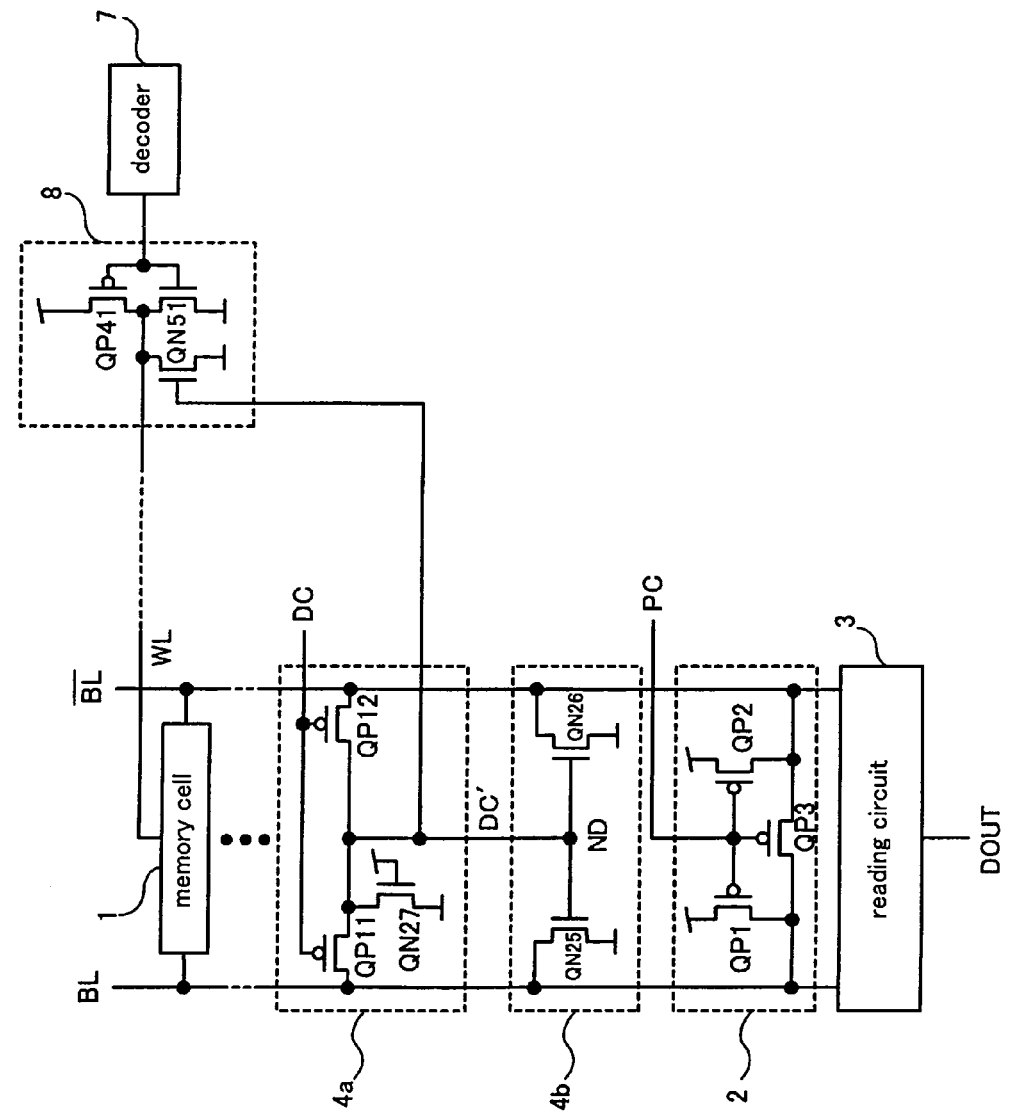
FIG. 20 is an example of a circuit diagram according to a preferred embodiment 19 of the present invention.

FIG. 20 illustrates a circuit configuration of a semiconductor storage device according to a preferred embodiment 19 of the present invention. The present preferred embodiment (FIG. 20) is a modified embodiment of the preferred embodiment 18, and is characterized in that a word line activation tilt adjusting circuit (NMOS transistor QN51) is connected in parallel to an NMOS transistor in the final output stage of the word line WL, and the NMOS transistor QN51 is controlled by the step-down control node ND for the output signal of the bit line potential monitor circuit 4a.

When the step-down control node ND is at "H" level during the step-down of the bit lines BL and BL⁻, the word line activation tilt adjusting circuit (NMOS transistor QN51) is in the ON state. Even though the decoding operation is executed at the time, the tilt of the activation of the word line WL is moderate, and the potential of the word line WL is not increased to the power supply voltage level because the word line activating circuit (transistor QP41) and the word line activation tilt adjusting circuit (NMOS transistor QN51) are simultaneously turned on. As the step-down control signal DC' is closer to "L" level, the transistor QN51 is gradually turned off. Therefore, the tilt of the activation of the word line WL is improved (becomes moderate), and the potential of the word line WL reaches the power supply voltage level. As a result, the destruction of the data in the memory cell 1, which is caused when the word line WL is rapidly activated in the state where the potentials of the bit lines BL and BL⁻ are not sufficiently stepped down yet, can be prevented. The tilt of the activation of the word line WL denotes a speed at which the potential for selecting the memory cell 1 is increased.

Referred Embodiment 20

Figure 21:
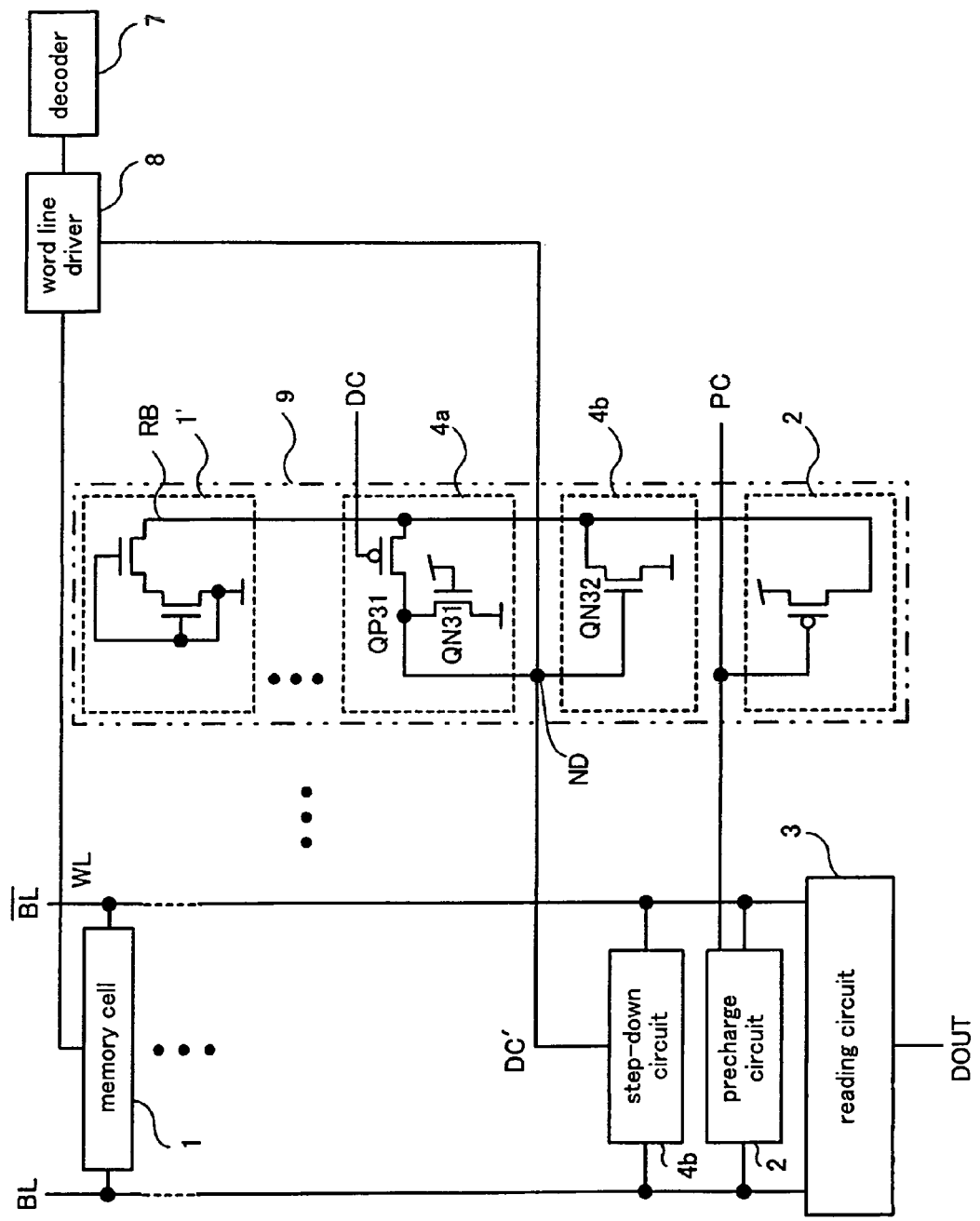
FIG. 21 is an example of a circuit diagram according to a preferred embodiment 20 of the present invention.

FIG. 21 illustrates a circuit configuration of a semiconductor storage device according to a preferred embodiment 20 of the present invention. The semiconductor storage device according to the present preferred embodiment comprises a replica column 9. The replica column 9 comprises a replica memory cell 1' which is not used for the storage of data, a replica bit line RB to which a plurality of replica memory cells 1' are connected, a potential monitor circuit 4a connected to between the replica bit line RB and the step-down control node ND, and an NMOS transistor QN32 which is connected to between the step-down control node ND and the ground and is constantly in the ON state. In the semiconductor storage device according to the present preferred embodiment thus constituted, the step-down circuit 4b, which is connected to the bit lines BL and BL⁻ used for data storage, is controlled by the voltage of the step-down control node ND. The step-down control node ND is inputted to the word line activation control circuit or the word line activation tilt adjusting circuit described earlier in the preferred embodiments referring to FIGS. 16-20.

In the semiconductor storage device according to the present preferred embodiment, the transistor of the optical dummy pattern provided in the periphery of the memory cell array can constitute the replica memory cell 1'. Therefore, the bit line step-down control circuit and the word line activation tilt adjusting circuit can be realized without any increase of the circuit layout area.

Referred Embodiment 21

Figure 22:
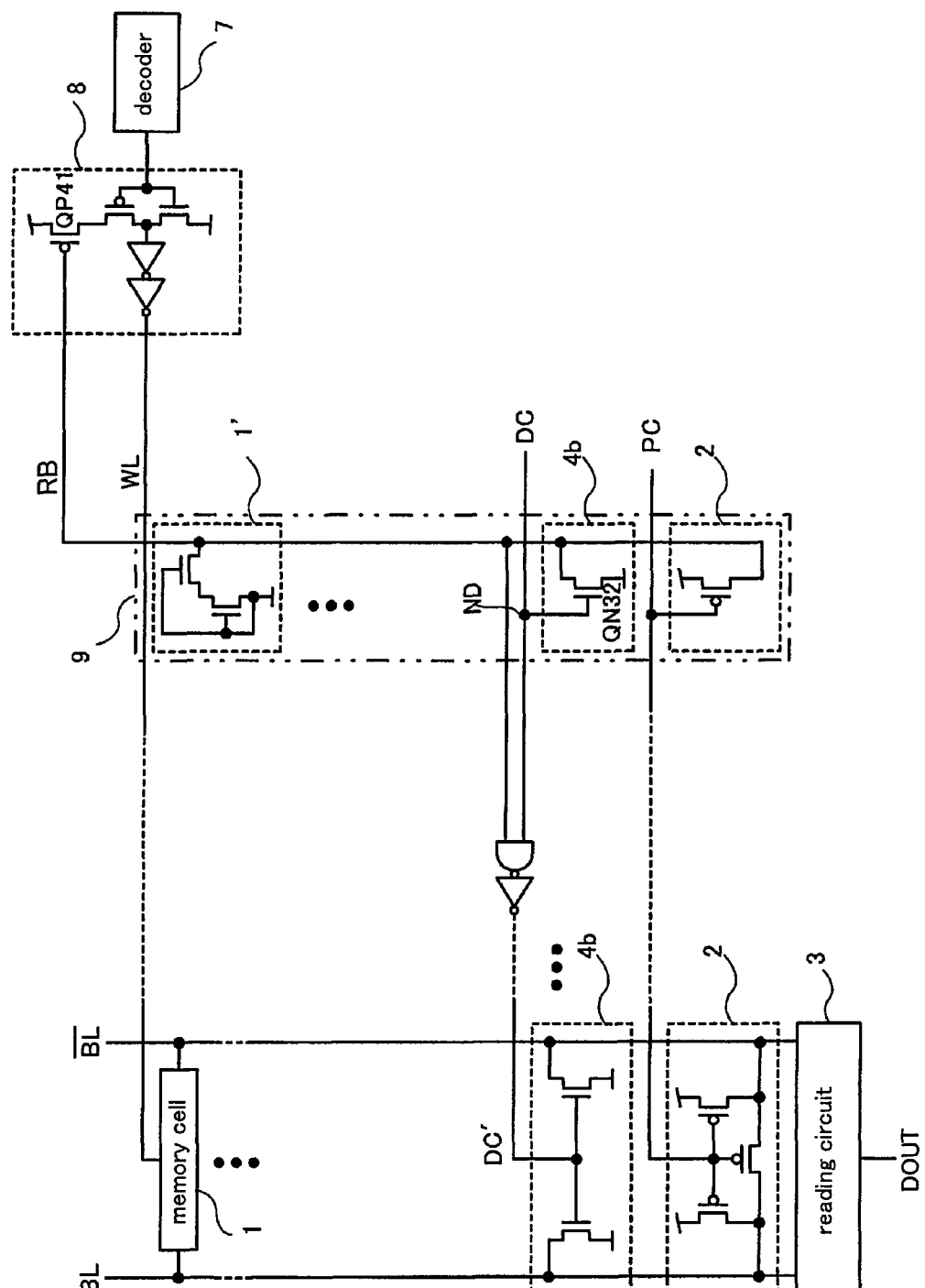
FIG. 22 is an example of a circuit diagram according to a preferred embodiment 21 of the present invention.

FIG. 22 illustrates a circuit configuration of a semiconductor storage device according to a preferred embodiment 21 of the present invention. The semiconductor storage device according to the present preferred embodiment comprises a replica column 9 (comprising a replica memory cell 1' which is not used for data storage and a replica bit line RB connected to the replica memory cell 1'), a memory cell 1 used for data storage, a plurality of data storage bit line columns (comprising bit lines BL and BL⁻ which are connected to the memory cell 1 and transmit potentials for writing and reading data), a word line driver 8 (circuit which activates the word line WL), and a word line activation tilt adjusting circuit (provided in the word line driver 8) which is a transistor QP41. In the semiconductor storage device according to the present preferred embodiment thus constituted, the step-down circuit 4b is controlled by the replica bit line RB, and further, the word line activation tilt adjusting circuit (transistor QP41) is controlled by the replica bit line RB. Thus constituted, any possible delay in the activation of the word line WL in the case where the step-down speed in the bit lines BL and BL⁻ is moderate can be prevented.

Further, the number of the circuit stages in the route starting from the replica bit line RB and reaching the step-down circuit 4b provided in the bit lines BL and BL⁻ for the data storage and the number of the circuit stages in the route starting from the replica bit line RB and reaching the output of the word line WL are compared to each other. Then, the same number of circuit stages are provided in the two routes, or the number of the former circuit stages is made larger than the latter. As a result, a proper processing order, that is, the completion of the step-down operation in the bit lines BL and BL⁻ is followed by the activation of the word line WL, can be more reliably observed.

Further, the transistor of the optical dummy pattern provided in the periphery of the memory cell array can constitute the replica memory cell 1'. Therefore, the bit line step-down control circuit and the word line activation tilt adjusting circuit can be realized without any increase of the circuit layout area.

Preferred Embodiment 22

Figure 23:
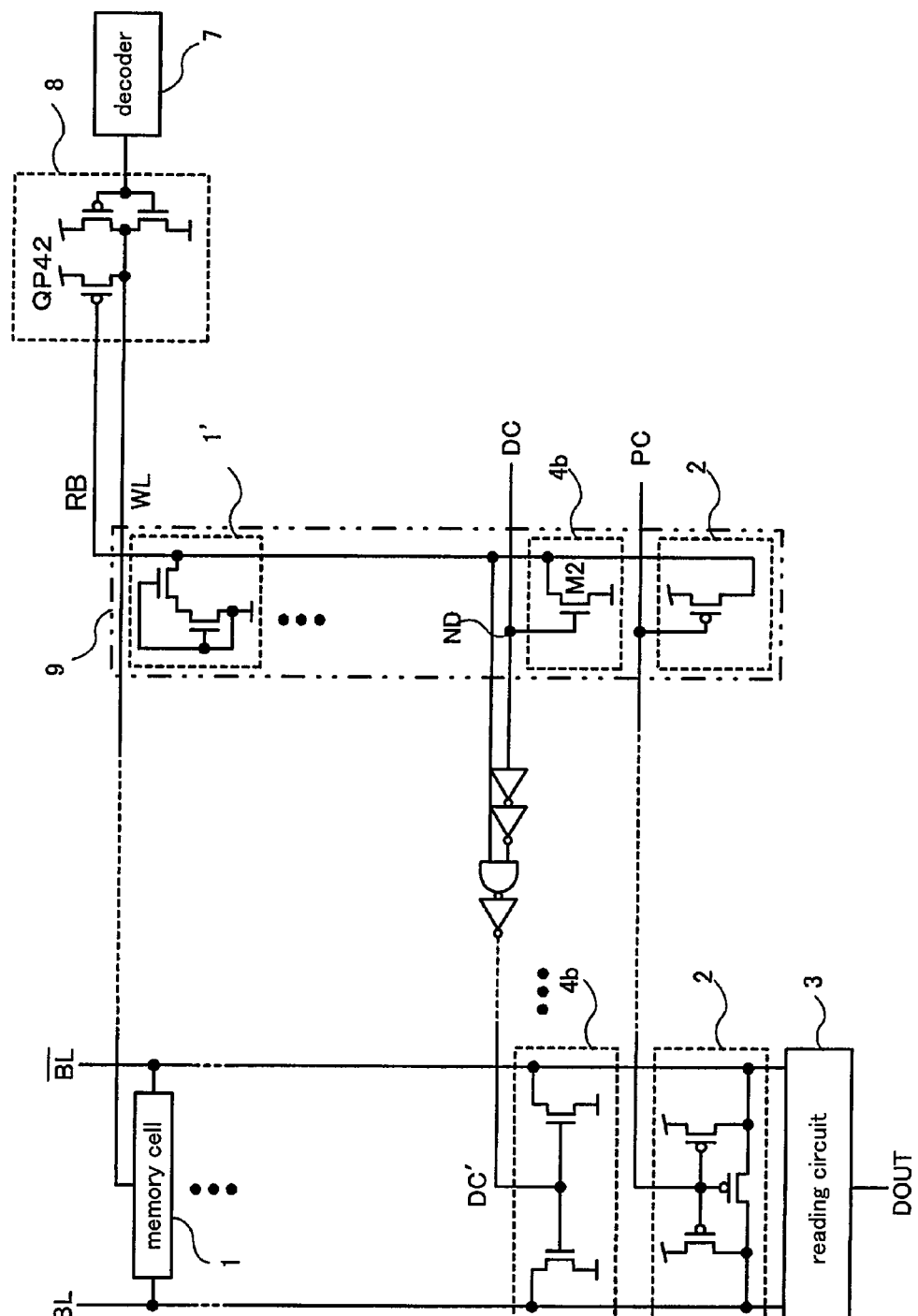
FIG. 23 is an example of a circuit diagram according to a preferred embodiment 22 of the present invention.
Figure 24A:
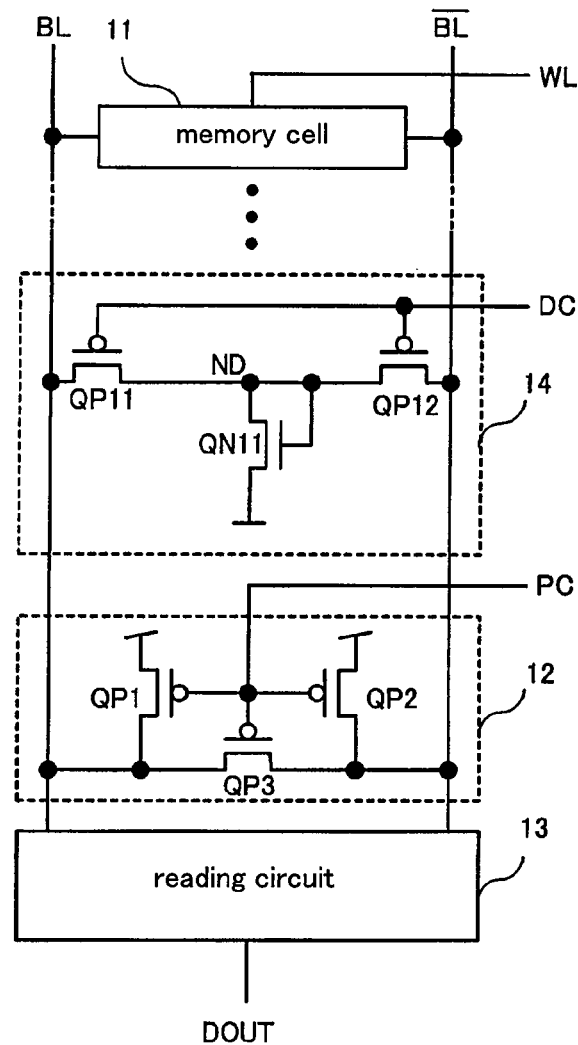
FIG. 24A is a circuit diagram of a semiconductor storage device relating to the present invention.
Figure 24B:
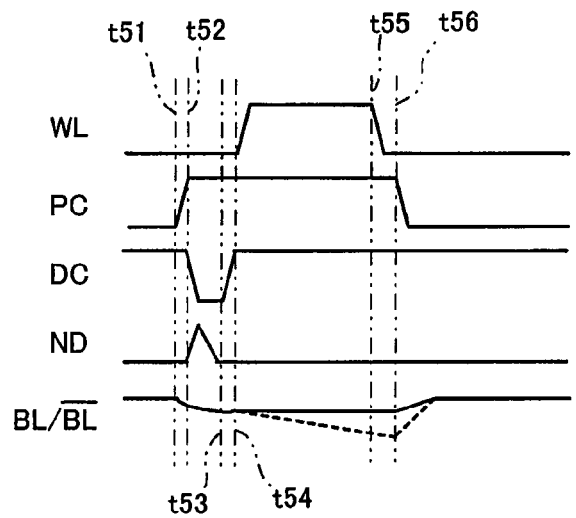
FIG. 24B is a timing chart of the semiconductor storage device illustrated in FIG. 24A.

FIG. 23 illustrates a circuit configuration of a semiconductor storage device according to a preferred embodiment 22 of the present invention. The semiconductor storage device according to the present preferred embodiment comprises a replica memory cell 1' which is not used for data storage, a replica column 9 (comprising a replica bit line RB connected to the replica memory cell 1'), a memory cell 1 used for data storage, a plurality of data storage bit line columns (comprising bit lines BL and BL⁻ which transmit potentials for writing and reading data) connected to the memory cell 1, a circuit which activates the word line WL (driver 8), and a word line activation tilt adjusting circuit (provided in the word line driver 8) which is a transistor QP42. In the semiconductor storage device according to the present preferred embodiment thus constituted, the step-down circuit 4b is controlled by the replica bit line RB, and further, the word line activation tilt adjusting circuit (transistor QP42) is controlled by the replica bit line RB in a manner similar to the preferred embodiment 21. Thus constituted, any possible delay in the activation of the word line WL in the case where the step-down speed in the bit lines BL and BL⁻ is moderate can be prevented.

Preferred Embodiment 23

In the preferred embodiment described earlier, when the bit lines BL and BL⁻ are stepped down before the word line WL is activated, the activation of the word line WL is allowed after the completion of the step-down operation is detected, or the data in the memory cell 1 is protected by the adjustment of the tilt of the activation. In the present preferred embodiment, the power supply voltage of the memory cell 1 is increased before the activation of the word line WL. Thus constituted, the data in the memory cell 1 can also be protected.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A semiconductor storage device comprising:
   a memory cell;
   bit lines connected to the memory cell, the bit lines transmitting potentials for reading and writing data;
   a bit line potential monitor circuit for monitoring the potentials of the bit lines prior to the writing and reading operations and generating an intermediate step-down control signal conformable to a monitoring result thereby obtained; and
   a step-down circuit for stepping down the bit lines based on the intermediate step-down control signal.

2. The semiconductor storage device as claimed in claim 1, wherein
   the bit line potential monitor circuit is provided so as to correspond to each of the bit lines and outputs AND logic or OR logic as the intermediate step-down control signal, and
   the step-down circuit steps down the potentials of each of the bit lines based on the AND logic output or the OR logic output of the plurality of intermediate step-down control signals outputted from the bit line potential monitor circuit.

3. The semiconductor storage device as claimed in claim 1, wherein
   the bit line potential monitor circuit is provided so as to correspond to each of the respective bit lines, and
   the step-down circuit shares the intermediate step-down control signal among the plurality of bit lines and then steps down the potentials of each of the bit lines based on the shared intermediate step-down control signal.

4. The semiconductor storage device as claimed in claim 1, further comprising:
   a replica memory cell which is not used for data storage; and
   a replica bit line connected to the replica memory cell, wherein
   the bit line potential monitor circuit monitors a potential of the replica bit line and generates the intermediate step-down control signal based on a monitoring result thereby obtained.

5. The semiconductor storage device as claimed in claim 1, further comprising:
   a word line for transmitting potentials for selecting the memory cell;
   a word line activating circuit for activating the word line; and
   a word line activation control circuit for preventing the word line activating circuit from activating the word line in a state where the step-down of the bit lines is insufficient, wherein
   the word line activation control circuit is controlled based on the intermediate step-down control signal.

6. The semiconductor storage device as claimed in claim 1, further comprising:
   a word line for transmitting potentials for selecting the memory cell;

a word line activating circuit for activating the word line; and a word line activation tilt adjusting circuit for adjusting a tilt of the activation of the word line by the word line activating circuit, wherein the word line activation tilt adjusting circuit is controlled based on the intermediate step-down control signal.

7. The semiconductor storage device as claimed in claim 1, further comprising:

a replica column comprising a replica memory cell which is not used for data storage and a replica bit line connected to the replica memory cell;

a plurality of data storage bit line columns each comprising the memory cell and the bit lines;

a word line for transmitting potentials for selecting the memory cell;

a word line activating circuit for activating the word line; and a word line activation control circuit for preventing the word line activating circuit from activating the word line in a state where the step-down of the bit lines is insufficient, wherein the step-down circuit and the word line activation control circuit control the step-down of the bit lines or the activation of the word line based on a potential of the replica bit line.

8. The semiconductor storage device as claimed in claim 1, further comprising:

a replica column comprising a replica memory cell which is not used for data storage and a replica bit line connected to the replica memory cell;

a plurality of data storage bit line columns each comprising the memory cell and the bit lines;

a word line for transmitting potentials for selecting the memory cell;

a word line activating circuit for activating the word line; and a word line activation tilt adjusting circuit for adjusting a tilt of the activation of the word line by the word line activating circuit, wherein the step-down circuit and the word line activation tilt adjusting circuit control the step-down of the bit lines or a tilt of the activation of the word line based on a potential of the replica bit line.

* * * * *